(12) United States Patent
Kijima et al.

(10) Patent No.: US 7,736,754 B2
(45) Date of Patent: Jun. 15, 2010

(54) DISPLAY DEVICE

(75) Inventors: Yasunori Kijima, Tokyo (JP); Tetsuo Shibanuma, Kanagawa (JP); Shigeyuki Matsunami, Kanagawa (JP); Yoichi Tomo, Kanagawa (JP)

(73) Assignee: Sony Corporation, Tokyo (JP)

( * ) Notice: Subject to any disclaimer, the term of this patent is extended or adjusted under 35 U.S.C. 154(b) by 671 days.

(21) Appl. No.: 10/597,981

(22) PCT Filed: Feb. 18, 2005

(86) PCT No.: PCT/JP2005/003080

§ 371 (c)(1),
(2), (4) Date: Aug. 15, 2006

(87) PCT Pub. No.: WO2005/076753

PCT Pub. Date: Aug. 25, 2005

(65) Prior Publication Data

US 2007/0181887 A1      Aug. 9, 2007

(30) Foreign Application Priority Data

| Feb. 18, 2004 | (JP) | 2002-040927 |
| Feb. 18, 2004 | (JP) | 2004-040928 |
| May 24, 2004 | (JP) | 2004-153204 |
| Nov. 18, 2004 | (JP) | 2004-334193 |
| Jan. 17, 2005 | (JP) | 2005-008548 |

(51) Int. Cl.
*H05B 33/14* (2006.01)
(52) U.S. Cl. ...................................... 428/690
(58) Field of Classification Search .................. None
See application file for complete search history.

(56) References Cited

U.S. PATENT DOCUMENTS 6,180,217 B1 * 1/2001 Ueda et al. .................. 428/212

(Continued)

FOREIGN PATENT DOCUMENTS

JP      06-188073      7/1994

(Continued)

OTHER PUBLICATIONS

Tsutsui et. al., Organic Semiconductor Element, JP-2003-264085 (Machine Language Translation) (2003).*

(Continued)

*Primary Examiner*—D. Lawrence Tarazano
*Assistant Examiner*—Gregory Clark
(74) *Attorney, Agent, or Firm*—Sonnenschein Nath & Rosenthal LLP

(57) ABSTRACT

In a stacked display device with light-emitting units composed of organic layers and stacked together, the use of a stable material in at least a portion of a charge generation layer makes it possible to achieve improvements in environmental stability and also to attain an improvement in the efficiency of injection of charges from the charge generation layer into the light-emitting units. The display device can be readily fabricated. In a display device (11) provided with a plurality of light-emitting units (14-1)(14-2), each of which includes at least an organic light-emitting layer (14c), stacked together between a cathode (16) and an anode (13), and also with a charge generation layer (15) held between the respective light-emitting units (14-1)(14-2), at least a portion of the charge generation layer (15) is composed of an oxide or fluoride which contains at least one of alkali metals and alkaline earth metals.

18 Claims, 16 Drawing Sheets

U.S. PATENT DOCUMENTS

| | | | |
|---|---|---|---|
| 6,245,471 B1 * | 6/2001 | Levin et al. | 430/58.4 |
| 6,340,537 B1 * | 1/2002 | Arai et al. | 428/690 |
| 6,492,041 B2 * | 12/2002 | Ishiskawa et al. | 428/690 |
| 6,656,608 B1 * | 12/2003 | Kita et al. | 428/690 |

FOREIGN PATENT DOCUMENTS

| | | |
|---|---|---|
| JP | 09-017574 | 1/1997 |
| JP | 11-176577 | 7/1999 |
| JP | 2001-085165 | 3/2001 |
| JP | 2003-045676 | 2/2003 |
| JP | 2003-264085 | 9/2003 |
| JP | 2003-272860 | 9/2003 |
| WO | 03/044829 | 5/2003 |

OTHER PUBLICATIONS

Zhu et. al, Lithium Fluoride modified..Applied Physics Letters 2001, vol. 79.,No. 8, p. 1205-1207.*

International Search Report dated Aug. 2, 2005.

* cited by examiner

DISPLAY DEVICE

TECHNICAL FIELD

This invention relates to a display device useful in a color display or the like, and especially to a self-emitting display device provided with one or more organic layers.

BACKGROUND ART

In FIG. 15, there is shown one construction example of self-emitting display devices equipped with organic layers (organic electroluminescent device). The display device 1 shown in this drawing is arranged on a transparent substrate 2 made of glass or the like, for example. The display device 1 is composed of an anode 3 arranged on the substrate 2 and made of ITO (indium tin oxide: transparent electrode), an organic layer 4 arranged on the anode 3, and a cathode 5 arranged on the organic layer. The organic layer 4 has, for example, a construction that a hole injection layer 4a, a hole transport layer 4b and an electron-transporting light-emitting layer 4c are stacked together in this order from the side of the anode. With the display device 1 constructed as described above, light produced upon recombination of electrons injected from the cathode and holes injected from the anode within the light-emitting layer 4c is outputted from the side of the substrate 2.

The lifetime of an organic electroluminescent device is generally determined by injected charges, and this problem can be resolved by lowering the initial brightness in each drive. However, the lowering of the initial brightness results in a limitation to the application in its practical use, negates by itself the potential of the organic electroluminescent device, and hence, makes it difficult to realize a next-generation television set.

For the resolution of this problem, it is necessary to increase the brightness without changing the drive current, in other words, to improve the efficiency or to realize a device construction that can obtain a similar brightness even when the drive current is lowered.

Therefore, stacked multiphoton emission devices (MPE devices) with a plurality of organic light-emitting devices arranged one over another have been proposed. Such proposals include the construction of an MPE device (display device 1') that as illustrated in FIG. 16, plural light-emitting units 4-1, 4-2, . . . , each being formed of an organic layer having at least a light-emitting layer 4c, are arranged one over another via insulating charge generation layers 6, respectively. Each charge generation layer 6 plays a role that upon impression of a voltage, injects holes into the light-emitting unit 4-2 arranged on the cathode 5 side of the charge generation layer 6 and also injects electrons into the light-emitting unit 4-1 arranged on the anode 3 side of the charge generation layer 6, and is composed of a metal oxide such as vanadium oxide ($V_2O_5$) or rhenium heptoxide ($Re_2O_7$).

To improve the efficiency of the above-described electron injection from the charge generation layer 6 into the light-emitting unit 4-1 on the side of the anode 3, an electron injection layer 7 which acts as an "in-situ reaction inducing layer" may be arranged on the anode 3 side of the charge generation layer 6. As the electron injection layer 7 which acts as such an "in-situ reaction inducing layer", a mixed layer of bathocuproine (BCP) and metal cesium (Cs) or a stacked film of an (8-quinolinato)lithium complex and aluminum is used, for example.

In a stacked organic electroluminescent device with the light-emitting units 4-1, 4-2, . . . stacked one over another via the charge generation layers 6, respectively, as described above, it is considered possible to double the brightness [cd/A], ideally without any change to the efficiency of light emission [lm/W], when two light-emitting units are stacked together; or to triple the brightness [cd/A], ideally without any change to the efficiency of light emission [lm/W], when three light-emitting units are stacked together (in this connection, see Japanese Patent Laid-Open No. 2003-45676 and Japanese Patent Laid-Open No 2003-272860).

In the display device 1' of the construction that the light-emitting units 4-1, 4-2 are stacked together as described with reference to FIG. 16, however, the material which makes up the electron injection layer 7 as the "in-situ reaction inducting layer" arranged on the anode 3 side of the charge generation layer 6 is very unstable. Therefore, the stoichiometric ratio of the individual materials that makes up the electron injection layer 7 is important, and its imbalance is considered to result in unstableness even as a layer.

For example, BCP is high in complex-forming ability and, if there is a free metal component or an organic material having an active site exists or in a like situation, there is a high possibility that BCP may form a complex with a surrounding material. BCP is, therefore, hardly usable when the stability of a device is taken into consideration. In addition, another problem is considered to exist in that a device making use of BCP has poor reliability in environmental stability.

When the charge generation layer 6 is formed with a metal oxide such as $V_2O_5$ or $Re_2O_7$ in such a stacked organic electroluminescent device, the efficiency of electron injection by direct contact of a general electron transport layer of $Alq_3$ or the like with the charge generation layer 6 is extremely low. Accordingly, the formation of an interface on the anode 3 side of the charge generation layer 6 becomes an extremely important point.

An object of the present invention is, therefore, to provide a stacked display device having light-emitting units composed of organic layers, respectively, and stacked together, which is provided with improved environmental stability by the use of a stable material, is provided with an improved efficiency of charge injection from a charge generation layer, which are held between each two adjacent ones of the light-emitting units, into the two light-emitting units, is hence high in brightness and excellent in long-term reliability, and is easy to fabricate.

DISCLOSURE OF INVENTION

To achieve such an object, a first display device according to the present invention is provided with a plurality of light-emitting units stacked together between a cathode and an anode, each of the light-emitting units including at least an organic light-emitting layer, and also with a charge generation layer held between each two adjacent ones of the light-emitting units, and is characterized in that the charge generation layer is composed of an oxide including at least one of alkali metals and alkaline earth metals.

A second display device according to the present invention is provided with a plurality of light-emitting units stacked together between a cathode and an anode, each of the light-emitting units including at least an organic light-emitting layer, and also with a charge generation layer held between each two adjacent ones of the light-emitting units, and is characterized in that at an interface on an anode side of each charge generation layer, an interfacial layer composed of a fluoride including at least one of alkali metals and alkaline earth metals is arranged.

A third display device according to the present invention is provided with a plurality of light-emitting units stacked together between a cathode and an anode, each of the light-emitting units including at least an organic light-emitting layer, and also with a charge generation layer held between each two adjacent ones of the light-emitting units, and is characterized in that the charge generation layer is formed of a mixed layer of at least one element of alkali metals and alkaline earth metals and an organic material and an intrinsic charge generation layer stacked in contact with each other in this order from the side of the anode.

In the first and second, invention display devices, the efficiency of charge injection into each light-emitting unit has been improved owing to the use of such a material as an oxide, which includes at least one of alkali metals and alkaline earth metals, or a fluoride, which includes at least one of alkali metals and alkaline earth metals, in at least a portion of each charge generation layer as described above. As a consequence, it becomes possible to achieve an improvement in brightness and improvements in lifetime characteristics, in other words, improvements in long-term reliability owing to improvements in environmental stability in a stacked display device having light-emitting units composed of organic layers, respectively, and stacked together. Further, the above-mentioned material such as the oxide, which includes at least one of alkali metals and alkaline earth metals, or the fluoride, which includes at least one of alkali metals and alkaline earth metals, is used in the form of the oxide or fluoride from the stage of the film formation, and therefore, is stable so that each charge generation layer making use of the material is also stable. Furthermore, such charge generation layers excellent in the characteristics of charge injection are formed with the stable material, and therefore, it is no longer required to conduct the formation or the like of their films while taking into consideration the stoichiometric ratio in the fabrication of the device, thereby facilitating the fabrication.

In the third invention display device, the stacked display device has been improved in the efficiency of light emission owing to the use of the charge generation layer made of stable materials such as an organic compound and an alkali metal and/or alkaline earth metal. As a consequence, in a stacked display device having light-emitting units composed of organic layers, respectively, and stacked together, it becomes possible to achieve an improvement in brightness and improvements in lifetime characteristics, in other words, improvements in long-term reliability owing to improvements in environmental stability as in the first and second display devices. Furthermore, such charge generation layers excellent in the characteristics of charge injection are formed with the stable material, and therefore, it is no longer required to conduct the formation or the like of their films while taking into consideration the stoichiometric ratio in the fabrication of the device, thereby facilitating the fabrication.

BEST MODES FOR CARRYING OUT THE INVENTION

Individual embodiments of the display device according to the present invention will hereinafter be described in detail with reference to the drawings.

First Embodiment

Figure 1:
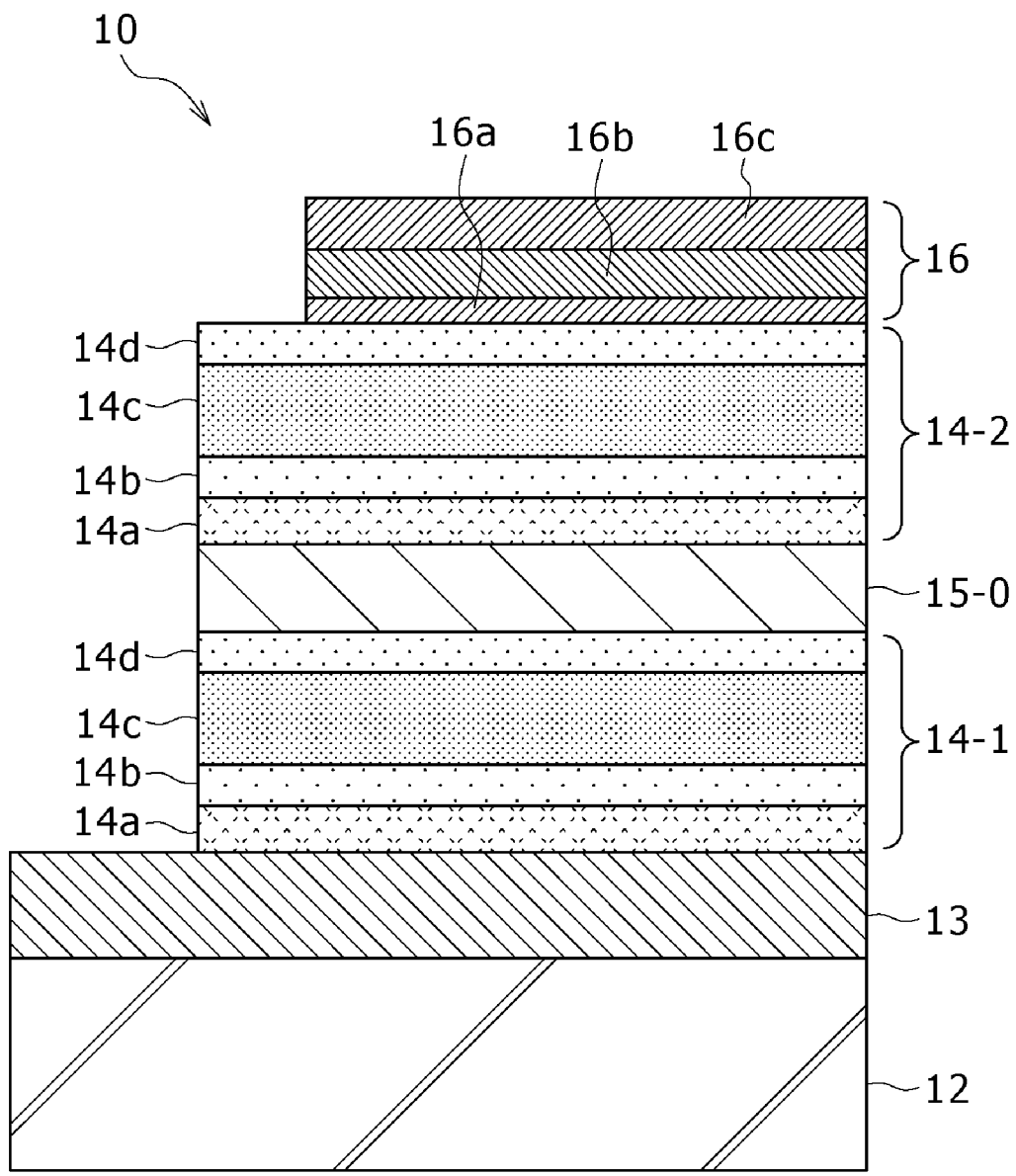
FIG. 1 is a cross-sectional view showing one construction example of a display device according to a first embodiment.

FIG. 1 is a cross-sectional view showing one construction example of a display device according to the first embodiment. The display device 10 shown in this drawing is a stacked display device 10 composed of light-emitting units stacked one over the other, and is provided with an anode 13 arranged on a substrate 12, plural light-emitting units 14-1, 14-2, . . . (two in this embodiment) stacked together and arranged on the substrate 13, a charge generation layer 15-0 arranged between these light-emitting units 14-1,14-2, and a cathode 16 arranged as a top layer on the light-emitting unit 14-2.

A description will hereinafter be made of the construction of a surface-emitting display device that light produced upon recombination of holes, which have been injected from the anode 13, and electrons, which have been generated in the charge generation layer 15-0, within the light-emitting unit 14-1 and light produced upon recombination of electrons, which have been injected concurrently from the cathode 16, and holes, which have been generated in the charge generation layer 15-0, within the light-emitting unit 14-2 are outputted from the side of the cathode 16 on a side opposite to the substrate 12.

Firstly, it is assumed that as the substrate 12 on which the display device 10 is to be arranged, a substrate is suitably selected and used from transparent substrates such as glass substrates, a silicon substrate, film-shaped flexible substrates and the like. When the drive system for a display constructed by using this display device 10 is the active matrix system, a TFT substrate with TFTs arranged corresponding to respective pixels is used as the substrate 12. In this case, the display is of such a construction that the surface-emitting display device 10 is driven using the TFTs.

Further, the anode 13 arranged as a lower electrode on the substrate 12 can use a material having a large work function from the vacuum level of an electrode material to permit an effective injection of holes, for example, chromium (Cr), gold (Au), an alloy of tin oxide ($SnO_2$) and antimony (Sb), an alloy of zinc oxide (ZnO) and aluminum (Al), oxides of these metals or alloys, and the like either singly or in a mixed form.

When the display device 10 is of the surface-emitting type, the construction of the anode 13 with a high-reflectivity material makes it possible to improve the efficiency of a light output to the outside owing to the effect of an interference and the effect of the high reflectivity. As such an electrode material, it is preferred to use an electrode composed primarily of Al, Ag or the like, for example. It is also possible to increase the charge injection efficiency by arranging a layer of a transparent electrode material having a large work function, for example, like ITO on the layer of such a high-reflectively material.

The anode 13 should be assumed to have been patterned corresponding to the pixels provided with TFTs, respectively, when the drive system for the display constructed by using the display device 10 is the active matrix system. Although an illustration is omitted in the drawing, an insulating film is arranged as an upper layer of the anode 13, and through openings of the insulating film, the surface of the anode 13 is exposed at the individual pixels.

The light-emitting units 14-1,14-2 are each composed, for example, of a pore injection layer 14a, a pore transport layer 14b, a light-emitting layer 14c and an electron transport layer 14d stacked one over another in this order from the side of the anode 13. These layers are each composed of an organic layer formed, for example, by vacuum evaporation or by another method such as, for example, spin coating. No particular limitation is imposed on the materials that make up the respective organic layers. In the case of the hole transport layer 14b, for example, it is possible to use a hole transport material such as a benzidine derivative, a styrylamine derivative, a triphenylmethane derivative or a hydrazone derivative.

Needless to say, the individual layers 14a to 14d may each be equipped with other function or functions. For example, the light-emitting layer 14c can be an electron-transporting, light-emitting layer which also acts as the electron transport layer 14d, or as an alternative, the light-emitting layer 14c can be a hole-transporting, light-emitting layer 14c. Further, each layer can be formed in a stacked structure. For example, the light transmitting layer 14c can be a white light emitting device formed of a blue light emitting portion, a green light emitting portion and a red light emitting portion.

Further, the light transmitting layer 14c can be a thin organic layer containing a trace amount of an organic substance such as a perylene derivative, a coumarin derivative, a pyran dye, or a triphenylamine derivative. In this case, the thin organic film can be formed by conducting coevaporation of trace molecules with the material that is to make up the light emitting layer 14c.

The above described, respective organic layers, for example, the hole injection layer 14a and hole transport layer 14b may each be of a stacked structure composed of plural layers. The hole injection layer 14a may be composed preferably of an organic material other than the arylamine type, for example, such as a azatriphenylene material. The use of such am organic material can increase the injection efficiency of holes into the light emitting unit 14-2.

The above-described, respective organic layers 14-1,14-2 can also be formed in different structures, although they may be of exactly the same structure. For example, by forming the light emitting unit 14-1 as an organic layer structure for an orange light emitting device and the light emitting unit 14-2 as an organic layer structure for a blue-green emitting device, the light to be emitted becomes white.

The charge generation layer 15-0, which is arranged between these light emitting unit 14-1 and light emitting unit 14-2, is composed with an oxide which contains at least one of alkali metals and alkaline earth metals. It is to be noted that Li, Na, K, Rb, Cs or Fr will hereinafter be commonly exemplified as alkali metal and Be, Mg, Ca, Sr, Ba or Ra will hereinafter be commonly exemplified as an alkaline metal. In the present invention, the charge generation layer 15-0 is composed of an oxide which contains at least one of these elements.

It is to be noted that, as the oxide which makes up the charge generation layer 15-0, a complex oxide containing at least one of alkali metals and alkaline earth metals and another element in combination can be used in addition a general alkali metal oxide or alkaline earth metal oxide. A specific example of the oxide that makes up a complex oxide together with an alkali metal or alkaline earth metal can be at least one oxide selected from metaborates, tetraborates, germanates, molybdates, niobates, silicates, tantalates, titanates, vanadates, tungstates, zirconates, carbonates, oxalates, chromites, chromates, dichromates, ferates, selenites, selenates, stannates, tellurites, tellurates, bismuthates, tetraborates, and metaborates. Among these, it is particularly preferred to use $Li_2CO_3$, $Cs_2CO_3$ or $Li_2SiO_3$ as a principal component. Representing oxides which contain at least one of alkali metals and alkaline earth metals, $Li_2CO_3$ will hereinafter be referred to.

This charge generation layer 15-0 may be, for example, in the form of a single-layer structure made of $Li_2CO_3$.

The charge generation layer 15-0 may also be a mixed layer formed by choosing $Li_2CO_3$ as a principal component and coevaporating, for example, a charge-transporting organic material such as a hole transport material or electron transport material as hopping sites for holes or electrons (charges) together with $Li_2CO_3$.

Further, the charge generation layer 15-0 may also be in the form of a stacked structure of $Li_2CO_3$ and a mixed layer of $Li_2CO_3$ and a electron-transporting organic material. In this case, the mixed layer of $Li_2CO_3$ and the electron-transporting organic material is stacked on an interface of the layer composed of $Li_2CO_3$, the interface being on the side of the anode 13. On the other hand, a mixed layer of $Li_2CO_3$ and a hole-transporting organic material is stacked on an interface of the layer composed of $Li_2CO_3$, the interface being on the side of the cathode 16. In this case, the hole transport material may preferably include an organic material other than the arylamine type, such as an azatriphenylene material. It is to be noted that such a stacked structure may be of a construction that the layer composed of $Li_2CO_3$ is provided on the side of at least one of the anode 13 and the cathode 16 with the mixed layer.

Furthermore, the charge generation layer 15-0 may also be in the form of a stacked structure of a layer composed of $Li_2CO_3$ and another layer composed of an oxide or complex oxide. Examples of the another oxide or complex oxide include other general oxides or complex oxides such as metaborates, tetraborates, germanates, molybdates, niobates, silicates, tantalates, titanates, vanadates, tungstates, zirconates, carbonates, oxalates, chromites, chromates, dichromates, ferates, selenites, selenates, stannates, tellurites, tellurates, bismuthates, tetraborates, and metaborates.

In addition, the charge generation layers 15-0 of the constructions as described above may each be of a construction with a fluoride stacked further thereon.

In this case, it is preferred to arrange a layer, which makes use of a fluoride containing at least one (at least one element) of alkali metals and alkaline earth metals, as an intermediate cathode layer (intermediate cathode layer) at an interface in the charge generation layer 15-0, the interface being on the side of the anode 13. It is also preferred to arrange a layer, which makes use of a fluoride containing at least one of alkali metals and alkaline earth metals, as an intermediate anode layer at an interface in the charge generation layer 15-0, the interface being on the side of the anode 13, with a conducting material layer interposed therebetween.

Specific examples of the alkali metal fluoride and alkaline earth metal fluoride include lithium fluoride (LiF), CsF, and $CaF_2$. The conducting material layer is supposed contain at least one of magnesium (Mg), silver (Ag) and aluminum (Al). Specifically, a conducting material layer made of MgAg or Al can be exemplified.

The charge generation layer 15-0 may also be provided at an interface thereof on the side of the cathode 16 with a layer, which is composed of a hole-injecting material having the phthalocyanine skeleton like copper phthalocyanine (CuPc), as an intermediate anode layer (intermediate anode layer).

It is to be noted that the above-described charge generation layers 15-0 and the respective layers stacked on their interfaces are not necessarily limited to distinctly separated constructions and the respective constituent materials may be mixed together at the interfaces of the individual layers.

Next, the cathode 16 is composed of a three-layer structure in which a first layer 16a, a second layer 16b, and in some instances, a third layer 16c are stacked together in this order from the side of the anode 13.

The first layer 16a is composed with a material having a small work function and good light transmission properties. Usable examples of such a material include $Li_2O$ and $Li_2CO_3$, the oxide and carbonate of lithium (Li); $CS_2CO_3$, the carbonate of cesium (Cs); $Li_2SiO_3$, a silicate; and mixtures of these oxides. However, the first layer 16a is not limited to such a material, and alkaline earth metals such as calcium (Ca) and barium (Ba), alkali metals such as lithium (Li) and cesium (Cs), metals having small work functions such as indium (In), magnesium (Mg) and silver (Ag), and fluorides and oxides of these metals may also be used either singly or as mixtures or alloys of these metals, fluorides and oxides.

The second layer 16b is composed of an electrode containing MgAg or an alkaline earth metal or an electrode of Al or the like. When the cathode 16 is composed of a semi-transparent electrode as in a surface-emitting, light-emitting device, the use of a thin-film MgAg electrode or Ca electrode makes it possible to output light. When the cathode 16 is composed of a material having light transmission properties and good electrical conductivity, the second layer 16b is composed of a semi-transparent reflecting material, for example, such as Mg—Ag especially in the case that the display device 10 is a surface-transmitting device formed in the cavity structure that light is outputted by causing it to resonate between the anode 13 and the cathode 16. Owing to this construction, light is reflected at the interface of the second layer 16b and the interface of the anode 13 having light reflectivity, thereby bringing about the cavity effect.

Moreover, the third layer 16c can be formed as a sealing electrode, through which light can be outputted, by arranging a transparent lanthanoid oxide for the inhibition of a deterioration of the electrode.

The above-described first layer 16a, second layer 16b and third layer 16c can be formed by a process such as vacuum evaporation, sputtering of plasma CVD. When the drive system for the display constructed by using the display device is the active matrix system, the cathode 16 may be formed in the form of a solid film over the substrate 12 in such a state that the cathode 16 is insulated from the anode 13 by an unillustrated insulating film surrounding the periphery of the anode 13 and the stacked films of the light-emitting unit 14-1 to the light-emitting unit 14-2, and may be used as an electrode common to the individual pixels.

The electrode structure of the cathode 16 illustrated in the drawing is a three-layer structure. Insofar as the stacked structure of the cathode 16 is needed for the functional isolation of the individual layers which make up the cathode 16, however, the cathode 16 can be formed of the second layer 16b alone, or a transparent electrode of ITO or the like can be formed further between the first layer 16a and the second layer 16b. Obviously, the cathode 16 can take a stacked structure of layers in a combination optimal for the structure of a device to be fabricated.

In the display device 10 of the above-described construction, the efficiency of electron injection from the charge generation layer 15-0 into the light-emitting unit 14-1 on the side of the anode 13 has been improved owing to the holding of the charge generation layer 15-0, which is composed primarily of $Li_2CO_3$, a stable material, between the light-emitting units 14-1 and 14-2. The stacked display device 10 with the light-emitting units 14-1,14-2 stacked together via the charge generation layer 15-0 is provided with stability.

Especially when a layer which makes use of a fluoride containing at least one of alkali metals and alkaline earth metals is arranged as an intermediate cathode layer at an interface in the charge generation layer 15-0 on the side of the anode 13, the construction of the intermediate cathode layer with a layer of such a conductive layer as MgAg and a layer, which is arranged on the side of the anode 13 of the conducting material layer and is formed of a fluoride containing at least one of alkali metals and alkaline earth metals, can enhance the effect of increasing the efficiency of electron injection from the charge generation layer 15-0 into the light-transmitting unit 14-1 arranged on the anode 13 side of the charge generation layer 15-0.

It is also possible to enhance the efficiency of hole injection from the charge generation layer 15-0 into the light-emitting unit 14-2, which is arranged on the cathode 16 side of the charge generation layer 15-0, by providing the charge generation layer 15-0 with an intermediate anode layer having the phthalocyanine skeleton (not shown).

As a consequence, it becomes possible to achieve not only an improvement in brightness but also improvements in lifetime characteristics, in other words, improvements in long-term reliability owing to improvements in environmental stability. Furthermore, the charge generation layer 15-0 excellent in the characteristics of charge injection are formed with the stable material, and therefore, it is no longer required to conduct the formation or the like of their films while taking into consideration the stoichiometric ratio in the fabrication of the device, thereby facilitating the fabrication. Moreover, compared with the use of a conventional charge generation layer formed of $V_2O_5$, the drive voltage can be reduced as a still further advantageous effect, thereby making it possible to achieving further improvements in long-term reliability.

Second Embodiment

Figure 2:
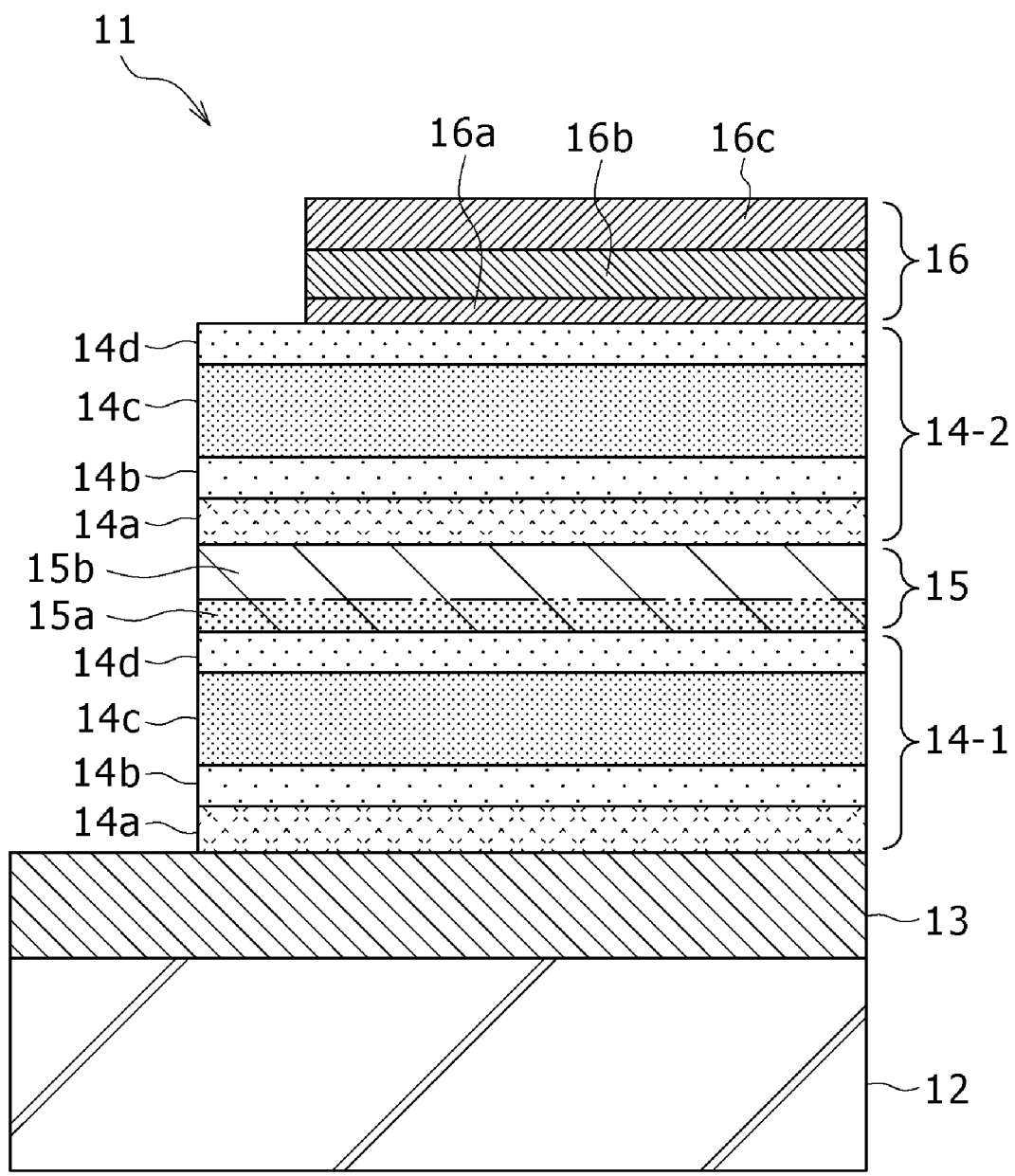
FIG. 2 is a cross-sectional view showing one construction example of a display device according to a second embodiment.

FIG. 2 is a cross-sectional view showing one construction example of a display device according to the second embodiment. A display device 11 shown in this drawing is different in the construction of a charge generation layer 15 from the display device 10 described with reference to FIG. 1, and in the remaining construction, they are supposed to be similar to each other. Centering around the charge generation layer 15, the construction of the display device 11 according to the second embodiment will hereinafter be described in detail.

Specifically, in the display device 11 according to the second embodiment, the charge generation layer 15 arranged between the light-emitting unit 14-1 and the light-emitting unit 14-2 has been formed using an oxide which contains at least one (at least one element) of alkali metals and alkaline earth metals. This charge generation layer 15 has a construction that an interfacial layer 15a and an intrinsic charge generation layer 15b are stacked together in this order from the side of the anode 13. It is to be noted that this interfacial layer 15a acts as a cathode for the light-emitting unit 14-1 arranged in contact with the anode 13. Therefore, this interfacial layer 15a will hereinafter be referred to as "an intermediate cathode layer 15a". This intermediate cathode layer 15a is supposed to have been formed using an oxide which contains at least one of alkali metals and alkaline earth metals.

The intrinsic charge generation layer 15b arranged in contact with the intermediate cathode layer 15a is supposed to have been formed using $V_2O_5$, a charge generation layer, as disclosed in Japanese Patent Laid-Open No. 2003-45676 and Japanese Patent Laid-Open No 2003-272860, or is supposed to have been formed using an organic compound to be described subsequently herein.

As the oxide which makes up the intermediate cathode layer 15a and contains at least one of alkali metals and alkaline earth metals, a similar oxide as described above in connection with the first embodiment is used.

Especially preferably, the intermediate cathode layer 15a can be formed of $Li_2SiO_3$ among them.

As the material which makes up the intrinsic charge generation layer 15b, organic compounds represented by the following formula (1) are usable in addition to $V_2O_5$ and the like.

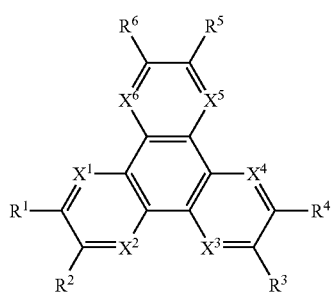

Formula (1)

In the formula (1), $R^1$ to $R^6$ are each independently a substituent selected from a hydrogen atom, a halogen atom, a hydroxyl group, an amino group, an arylamino group, an aryloxy group, a substituted or unsubstituted carbonyl group having not more than 20 carbon atoms, a substituted or unsubstituted carbonyl ester group having not more than 20 carbon atoms, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a substituted or unsubstituted aryl group having not more than 30 carbon atoms, a substituted or unsubstituted heterocyclic group having not more than 30 carbon atoms, a nitrile group, a nitro group, a cyano group, or a silyl group. In $R^1$ to $R^6$, each two adjacent ones of $R^m$ (m: 1 to 6) may be fused together via a cyclic structure associated therewith. Further, $X^1$ to $X^6$ in the formula (1) are each independently a carbon or nitrogen atom.

Specific examples of such organic compounds represented by the formula (1) include organic compounds of structural formula (1)-1 to structural formula (1)-64 presented below in Table 1 to Table 7. In these structural formulas, [Me] designates methyl ($CH_3$), [Et] ethyl ($C_2H_5$), [Pr] propyl ($C_3H_7$), and [Ph] phenyl ($C_6H_5$). Structural formula (1)-61 to structural formula (1)-64 indicate examples of organic compounds that among $R^1$ to $R^6$ in the formula (1), each two adjacent ones of $R^m$ (m: 1 to 6) are fused together via a cyclic structure associated therewith.

TABLE 1

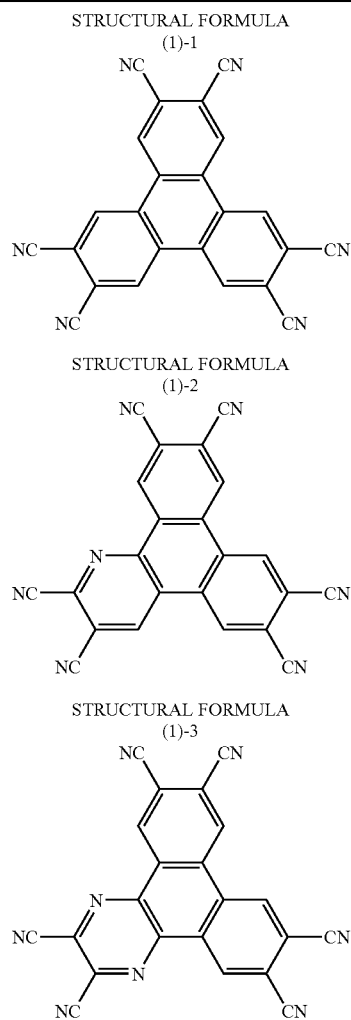

TABLE 1-continued
STRUCTURAL FORMULA
(1)-4
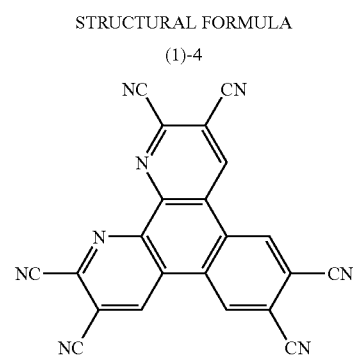
STRUCTURAL FORMULA
(1)-5
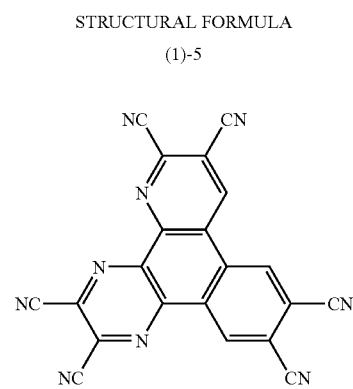
STRUCTURAL FORMULA
(1)-6
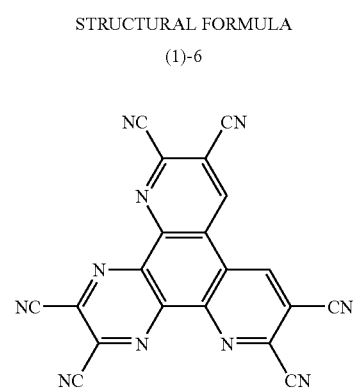
STRUCTURAL FORMULA
(1)-7
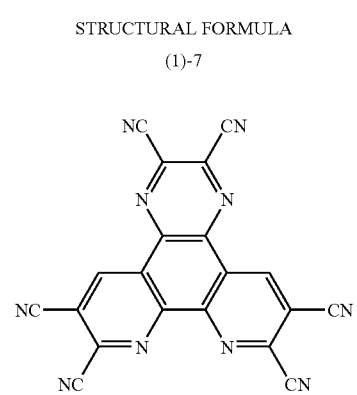
TABLE 1-continued
STRUCTURAL FORMULA
(1)-8
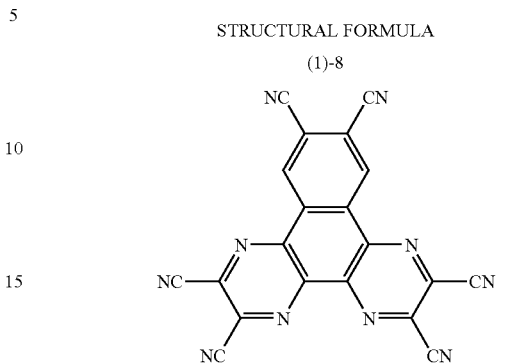
STRUCTURAL FORMULA
(1)-9
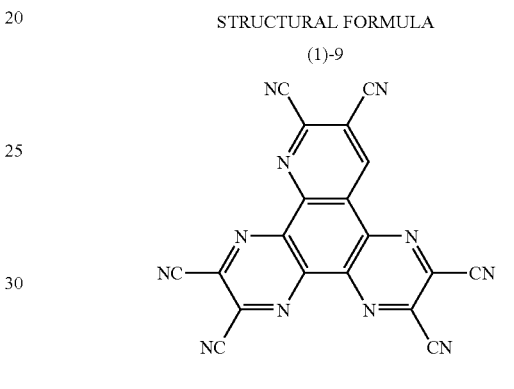
STRUCTURAL FORMULA
(1)-10
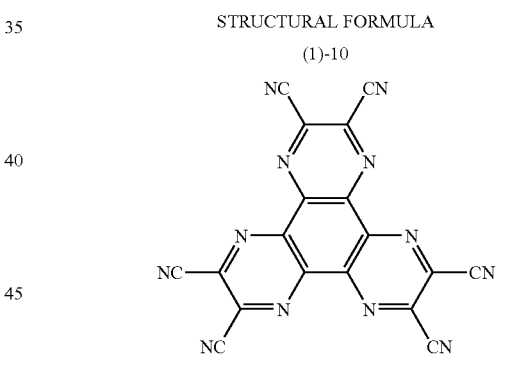
TABLE 2
STRUCTURAL FORMULA
(1)-11
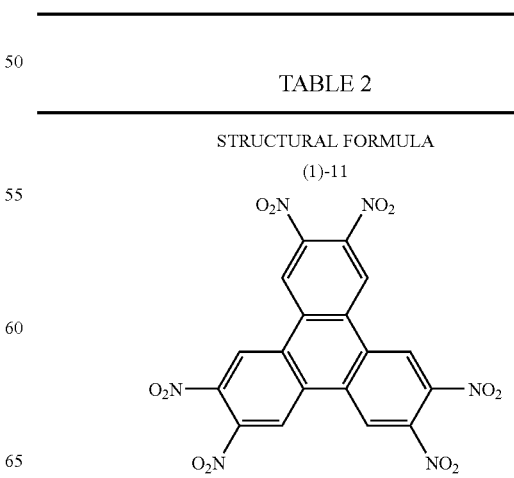

TABLE 2-continued
STRUCTURAL FORMULA
(1)-12
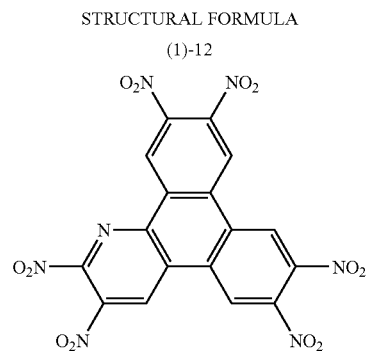
STRUCTURAL FORMULA
(1)-13
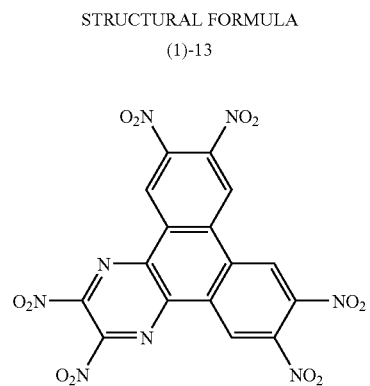
STRUCTURAL FORMULA
(1)-14
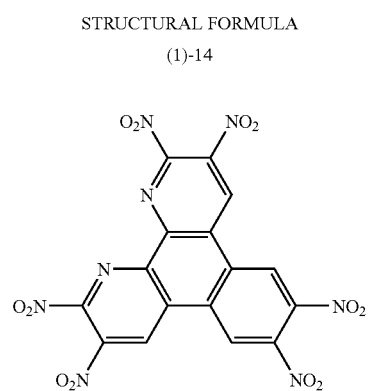
STRUCTURAL FORMULA
(1)-15
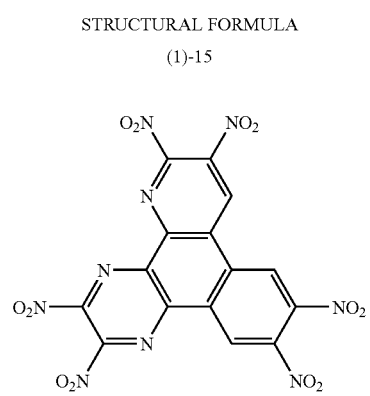
TABLE 2-continued
STRUCTURAL FORMULA
(1)-16
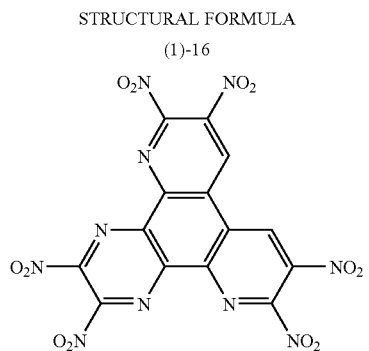
STRUCTURAL FORMULA
(1)-17
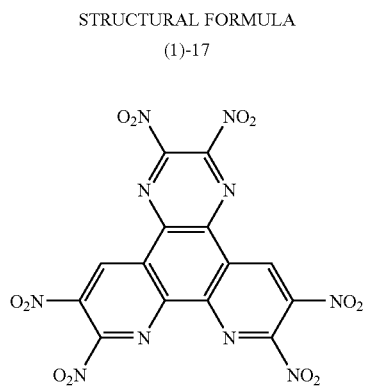
STRUCTURAL FORMULA
(1)-18
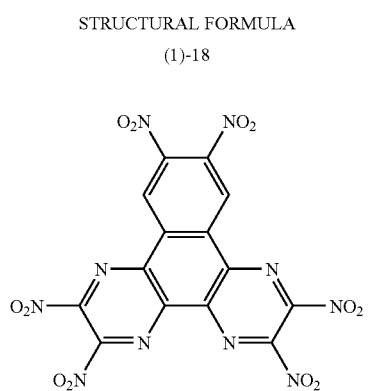
STRUCTURAL FORMULA
(1)-19
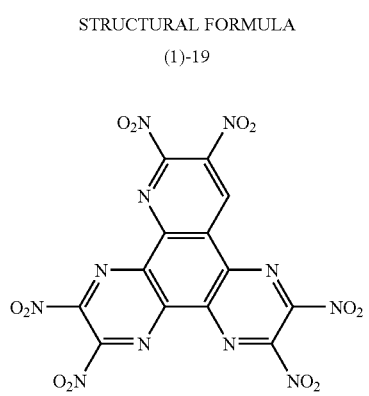

TABLE 2-continued
STRUCTURAL FORMULA
(1)-20
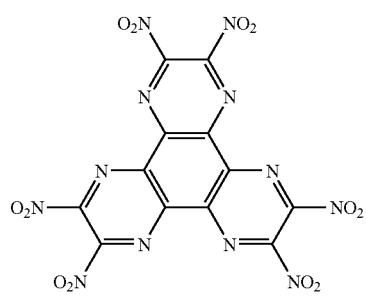
TABLE 3
STRUCTURAL FORMULA
(1)-21
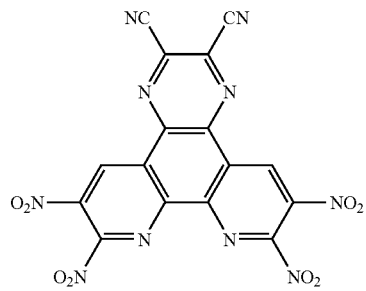
STRUCTURAL FORMULA
(1)-22
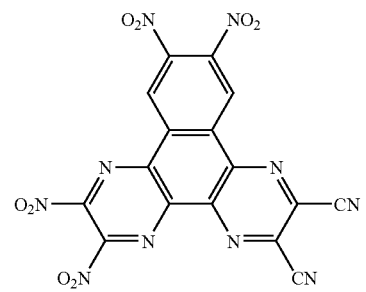
STRUCTURAL FORMULA
(1)-23
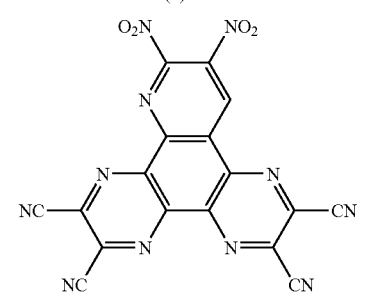
TABLE 3-continued
STRUCTURAL FORMULA
(1)-24
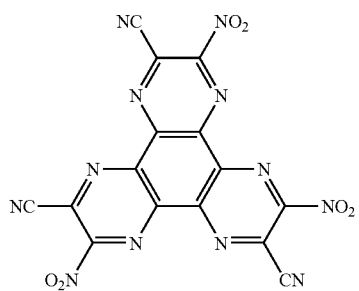
STRUCTURAL FORMULA
(1)-25
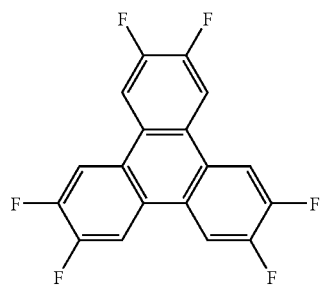
STRUCTURAL FORMULA
(1)-26
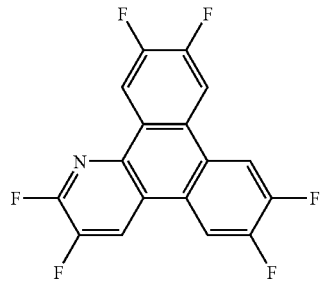
STRUCTURAL FORMULA
(1)-27
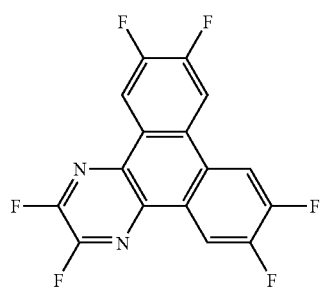

TABLE 3-continued
STRUCTURAL FORMULA
(1)-28
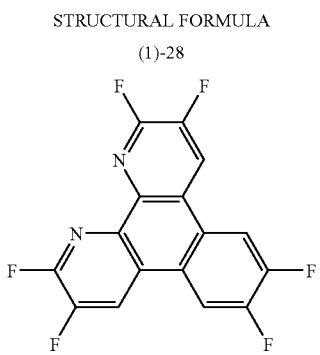
STRUCTURAL FORMULA
(1)-29
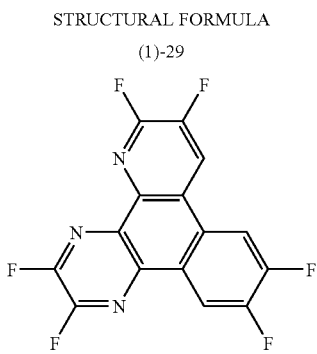
STRUCTURAL FORMULA
(1)-30
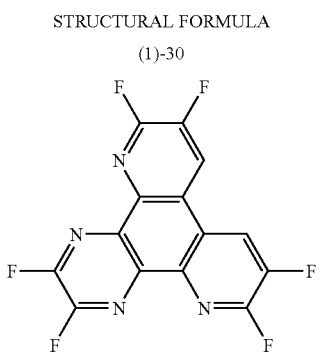
TABLE 4
STRUCTURAL FORMULA
(1)-31
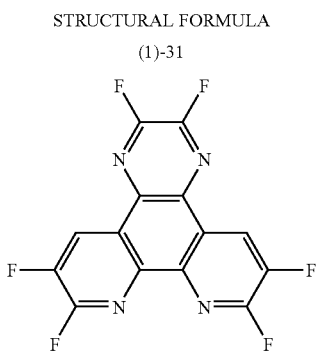
TABLE 4-continued
STRUCTURAL FORMULA
(1)-32
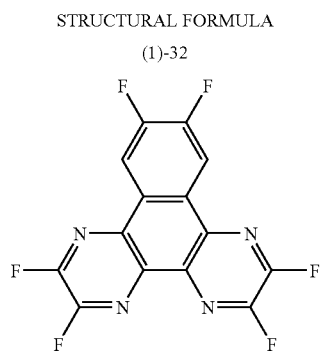
STRUCTURAL FORMULA
(1)-33
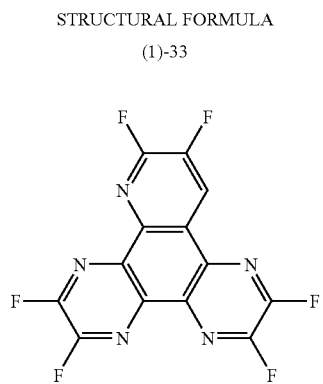
STRUCTURAL FORMULA
(1)-34
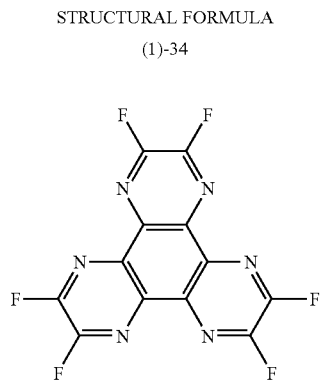
STRUCTURAL FORMULA
(1)-35
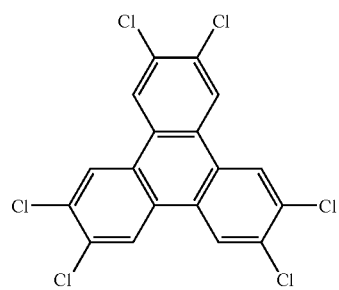

TABLE 4-continued
STRUCTURAL FORMULA
(1)-36
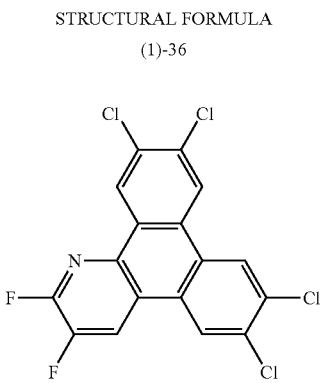
STRUCTURAL FORMULA
(1)-37
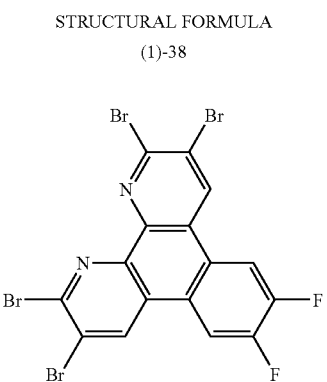
STRUCTURAL FORMULA
(1)-38
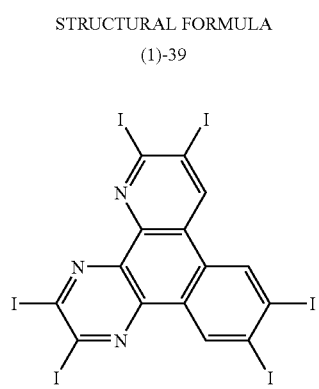
STRUCTURAL FORMULA
(1)-39
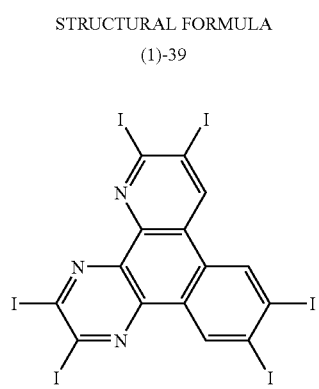
TABLE 4-continued
STRUCTURAL FORMULA
(1)-40
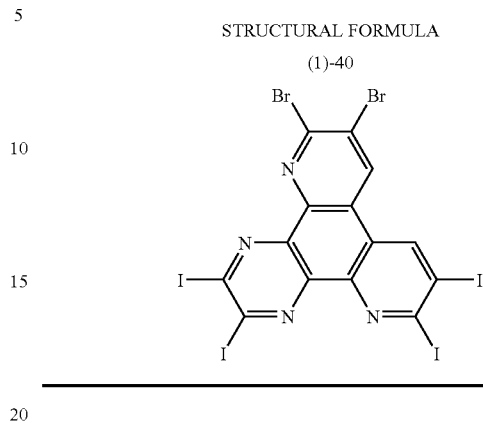
TABLE 5
STRUCTURAL FORMULA
(1)-41
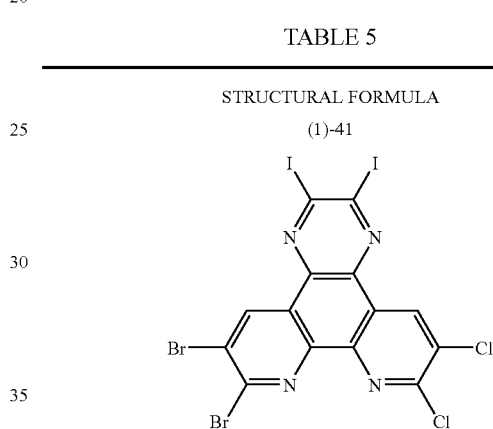
STRUCTURAL FORMULA
(1)-42
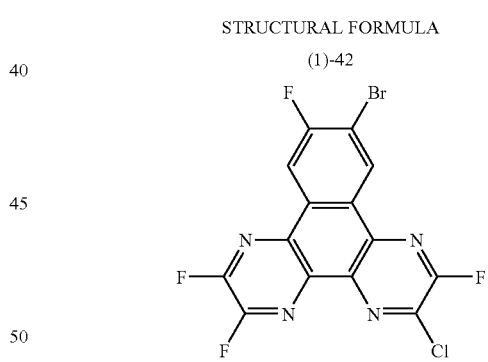
STRUCTURAL FORMULA
(1)-43
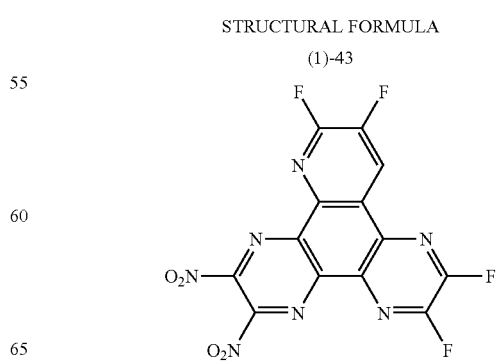

TABLE 5-continued
STRUCTURAL FORMULA
(1)-44
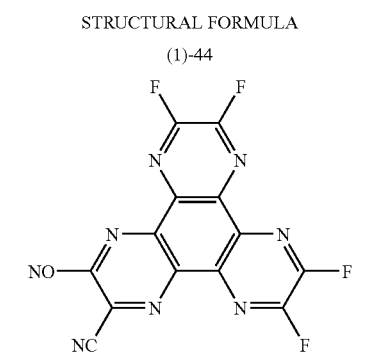
STRUCTURAL FORMULA
(1)-45
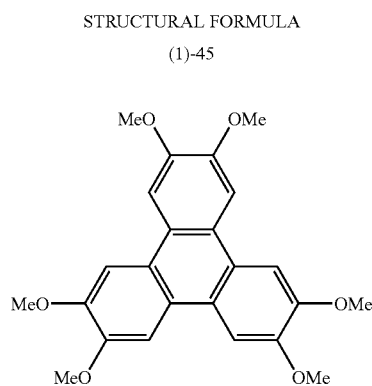
STRUCTURAL FORMULA
(1)-46
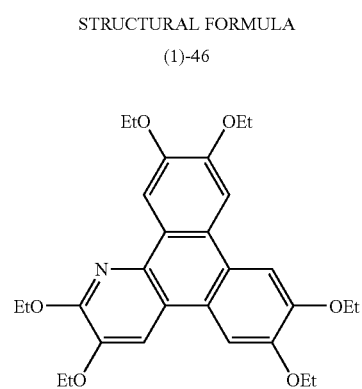
STRUCTURAL FORMULA
(1)-47
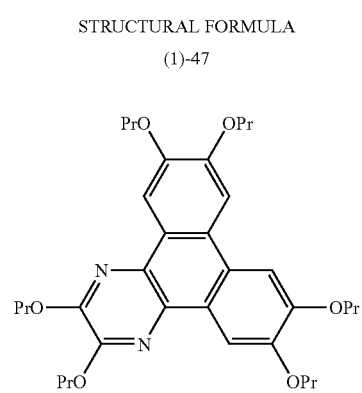
TABLE 5-continued
STRUCTURAL FORMULA
(1)-48
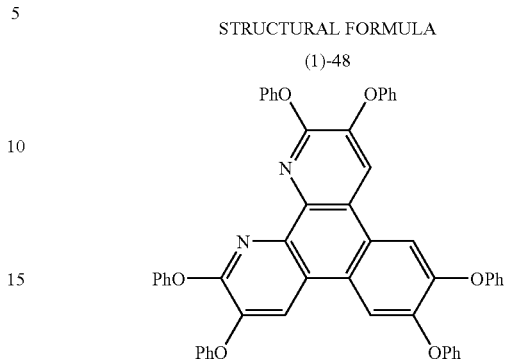
STRUCTURAL FORMULA
(1)-49
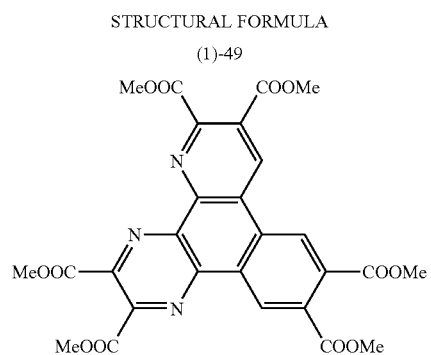
STRUCTURAL FORMULA
(1)-50
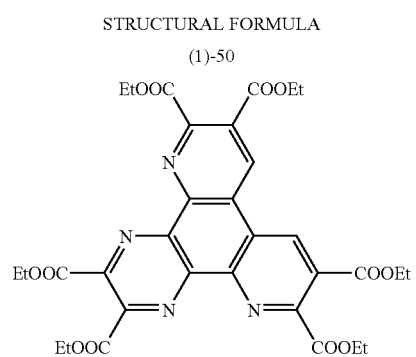
TABLE 6
STRUCTURAL FORMULA
(1)-51
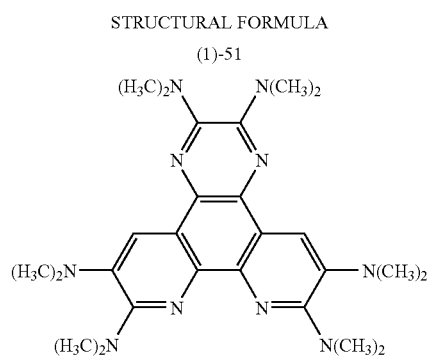

TABLE 6-continued
STRUCTURAL FORMULA (1)-52
STRUCTURAL FORMULA (1)-53
STRUCTURAL FORMULA (1)-54
STRUCTURAL FORMULA (1)-55
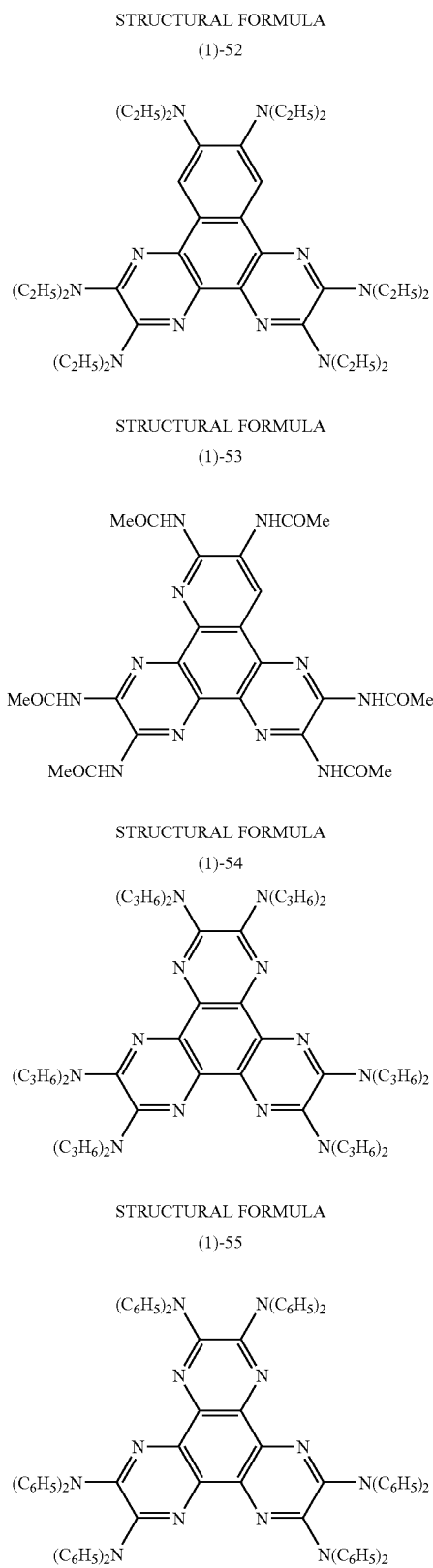
TABLE 6-continued
STRUCTURAL FORMULA (1)-56
STRUCTURAL FORMULA (1)-57
STRUCTURAL FORMULA (1)-58
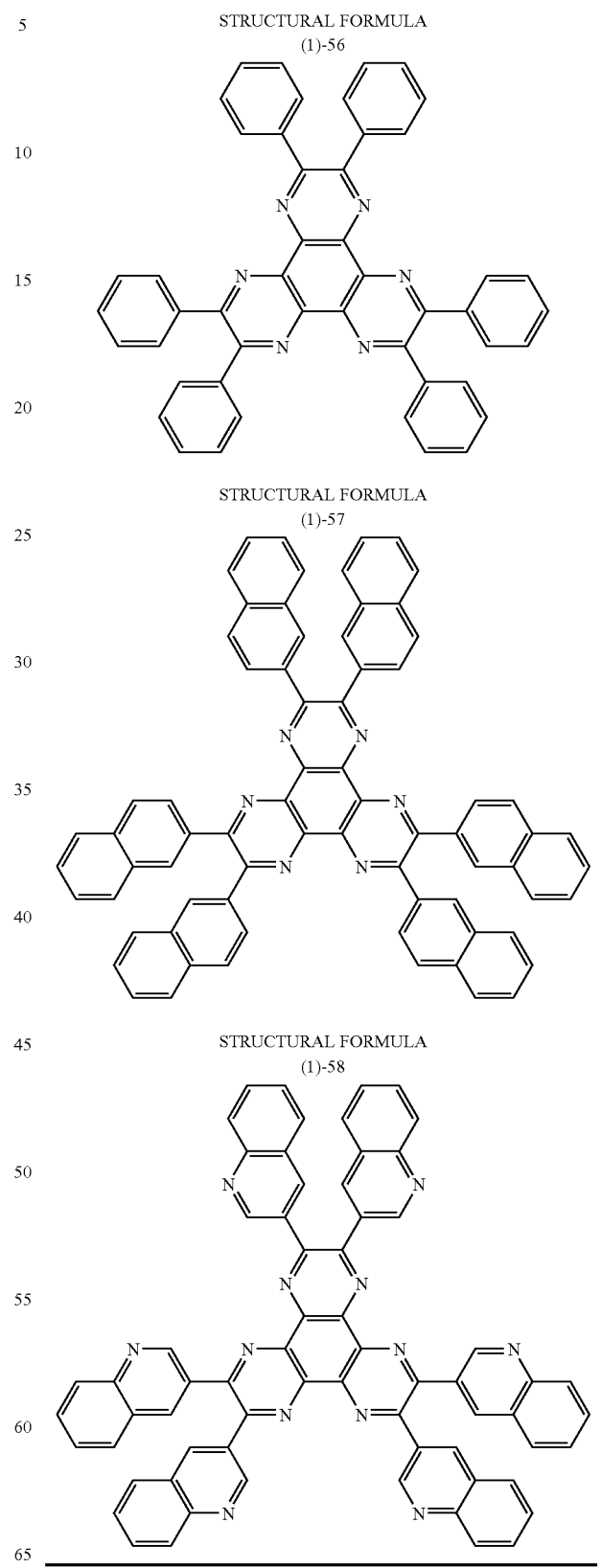

TABLE 7

STRUCTURAL FORMULA
(1)-59

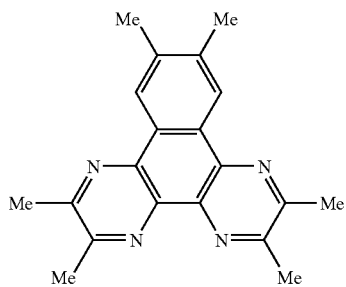

STRUCTURAL FORMULA
(1)-60

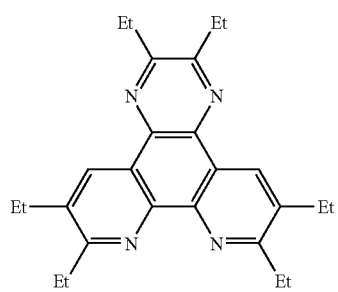

STRUCTURAL FORMULA
(1)-61

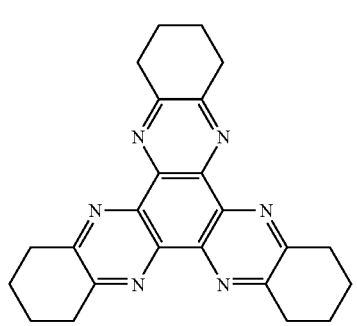

STRUCTURAL FORMULA
(1)-62

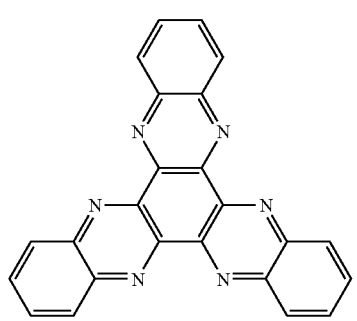

TABLE 7-continued

STRUCTURAL FORMULA
(1)-63

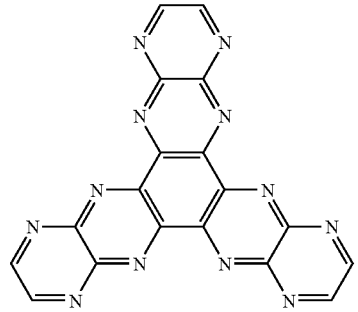

STRUCTURAL FORMULA
(1)-64

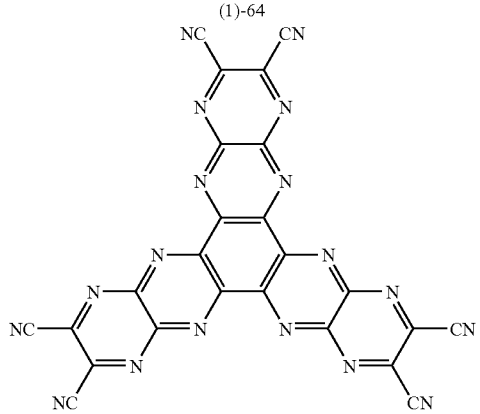

The above-described intermediate cathode layer 15a and intrinsic charge generation layer 15b are not necessarily limited to distinctly separated constructions, and the material which makes up the intrinsic charge generation layer 15b may be included in the intermediate cathode layer 15a, or vice versa.

The charge generation layer 15 may also have a constructions that together with the intermediate cathode layer 15a and intrinsic charge generation layer 15b, an intermediate anode layer (not shown) may be stacked in this order from the side of the anode 13. This intermediate anode layer is formed using an organic material having the phthalocyanine skeleton, and specifically, an intermediate anode layer made of copper phthalocyanine (CuPc) can be exemplified.

When the intrinsic charge generation layer 15b in the charge generation layer 15 has been formed using the organic compound represented by the formula (1), this intrinsic charge generation layer 15b may also serve as the hole injection layer 14a. In this case, it is not absolutely necessary to provide the light-emitting unit 14-2, which is arranged on the side of the cathode 16 relative to the charge generation layer 15, with the hole injection layer 14a.

In the display device 11 of the above-described construction according to the second embodiment, the efficiency of electron injection from the charge generation layer 15 into the light-emitting unit 14-1 on the side of the anode 13 has been improved owing to the use of an oxide, which contains at least one of alkali metals and alkaline earth metals, as the material that makes up the intermediate cathode layer 15a. In particular, the above-described oxide which makes up the intermediate cathode layer 15a in the charge generation layer 15 is fed as a stable material from the stage of film formation. The stabilization of the intermediate cathode layer 15a making use of the oxide, that is, the charge generation layer 15 has been assured.

It is also possible to enhance the efficiency of hole injection from the charge generation layer 15 into the light-emitting unit 14-2, which is arranged on the cathode 16 side of the charge generation layer 15, by arranging an intermediate anode layer made of an organic material having the phthalocyanine skeleton (not shown) at the cathode 16 side interface of the charge generation layer 15.

As a consequence, it becomes possible to achieve not only an improvement in brightness but also improvements in lifetime characteristics, in other words, improvements in long-term reliability owing to improvements in environmental stability. Furthermore, the charge generation layer 15 excellent in the characteristics of charge injection are formed with the stable material, and therefore, it is no longer required to conduct the formation or the like of their films while taking into consideration the stoichiometric ratio in the fabrication of the device, thereby facilitating the fabrication of the stacked display device 11 excellent in long-term reliability as mentioned above.

Even when the above-mentioned organic compound represented by the formula (1) is used as the intrinsic charge generation layer 15b in the charge generation layer 15, a charge injection efficiency of a similar level as in the conventional case making use of $V_2O_5$ is available. As the intrinsic charge generation layer 15b can be designed to also serve as a hole injection layer in this case, it is not absolutely necessary to specifically provide the light-emitting unit 14-2, which is arranged on the side of the cathode 16 relative to the charge generation layer 15, with the hole injection layer 14a, thereby making it possible to achieve simplification of the layer structure.

Third Embodiment

Figure 3:
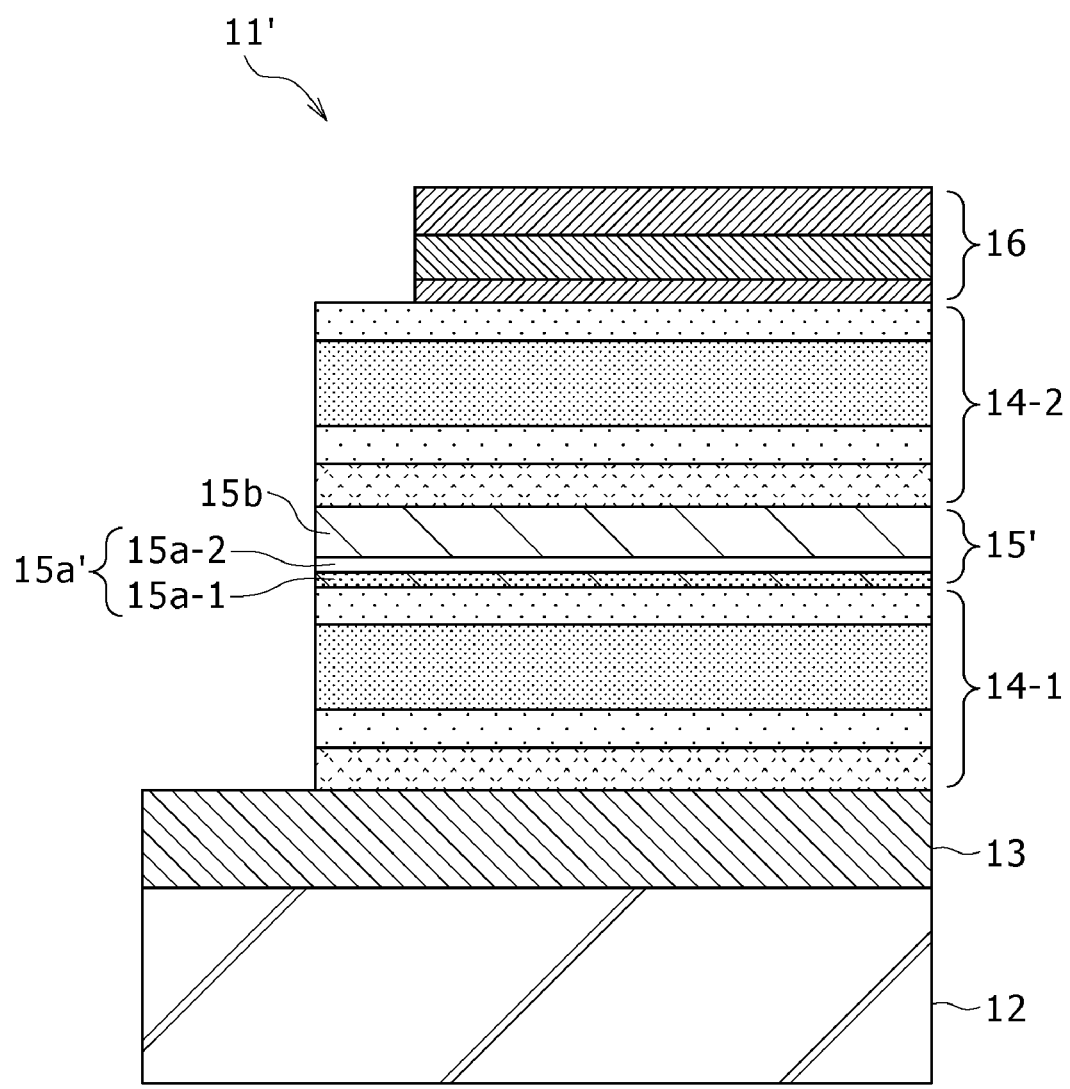
FIG. 3 is a cross-sectional view showing one construction example of a display device according to a third embodiment.

FIG. 3 is a cross-sectional view showing one construction example of a display device according to the third embodiment. A display device 11' shown in this drawing is different in the construction of a charge generation layer 15' from the display device 10 described with reference to FIG. 1, and in the remaining construction, they are supposed to be similar to each other. Centering around the charge generation layer 15', the construction of the display device 11' according to the third embodiment will hereinafter be described in detail.

Specifically, the charge generation layer 15' in the display device 11' according to the third embodiment has a construction that an interfacial layer 15a' and an intrinsic charge generation layer 15b are stacked together in this order from the side of the anode 13. Because this interfacial layer 15a' acts as a cathode for the light-emitting unit 14-1 arranged in contact with the anode 13 as in the second embodiment, this interfacial layer 15a' will hereinafter be referred to as "an intermediate cathode layer 15a'".

It is characterized in that in the charge generation layer 15' of such a construction, the intermediate cathode layer 15' uses a fluoride which contains at least one (at least one element) of alkali metals and alkaline earth metals. Particularly preferably, the intermediate cathode layer 15a' may be formed in a stacked construction of a fluoride layer 15a-1 and a conducting material layer 15a-2 or insulating material layer (15a-2') arranged in this order from the side of the anode 13. The fluoride layer 15a-1 is composed of a fluoride containing at least one of alkali metals and alkaline earth metals.

Specific examples of the fluoride, which makes up the fluoride layer 15a-1 and contains at least one of alkali metals and alkaline earth metals, include lithium fluoride (LiF), cesium fluoride (CsF), and calcium fluoride ($CaF_2$).

The material which makes up the conducting material layer 15a-2 is supposed to contain at least one of magnesium (Mg), silver (Ag) and aluminum (Al). Specifically, a conducting material layer 15a-2 made of MgAg or Al can be exemplified.

As the insulating material layer (15a-2'), a layer made of an oxide, which contains at least one (at least one element) of alkali metals and alkaline earth metals, can be suitably used. As the oxide containing at least one of alkali metals and alkaline earth metals as mentioned above, a similar oxide as described above in connection with the first embodiment can be used.

The intrinsic charge generation layer 15b arranged in contact with the intermediate cathode layer 15a' has been formed using $V_2O_5$, a charge generation layer, as disclosed in Japanese Patent Laid-Open No. 2003-45676 and Japanese Patent Laid-Open No. 2003-272860, or has been formed using the organic compound represented by the formula (1). When the intrinsic charge generation layer 15b in the charge generation layer 15' has been formed using the organic compound represented by the formula (1), this intrinsic charge generation layer 15b may also serve as the hole injection layer 14a. In this case, it is not absolutely necessary to provide the light-emitting unit 14-2, which is arranged on the side of the cathode 16 relative to the charge generation layer 15', with the hole injection layer 14a. Further, the charge generation layer 15' may have such a construction that an intermediate anode layer formed of an organic material having the phthalocyanine skeleton such as copper phthalocyanine (CuPc) (not shown) is stacked on the side of the cathode 16 relative to the intrinsic charge generation layer 15b. With respect to the foregoing, the third embodiment is similar to the second embodiment.

In the display device 11' of the above-described construction according to the third embodiment, the efficiency of electron injection from the charge generation layer 15' into the light-emitting unit 14-1 on the side of the anode 13 has been improved, because the charge generation layer 15' contains an oxide, which in turn contains at least one of alkali metals and alkaline earth metals, as the material that makes up the intermediate cathode layer 15a'. In particular, the oxide which makes up the intermediate cathode layer 15a' in the charge generation layer 15' and contains at least one of alkali metals and alkaline earth metals is fed as a stable material from the stage of film formation. The stabilization of the intermediate cathode layer 15a' making use of the oxide, that is, the charge generation layer 15' has been assured.

When this intermediate cathode layer 15a' has been formed by stacking the fluoride layer 15a-1, which is composed of a fluoride containing at least one of alkali metals and alkaline earth metals, and the conducting material layer 15a-2 such as MgAg one over the other in this order from the side of the anode 13, there is obtained an effect that further enhances the efficiency of electron injection into the light-emitting unit 14-1 arranged on the side of the anode 13 relative to the intermediate conducting layer 15a'.

It is also possible to enhance the efficiency of hole injection from the charge generation layer 15', which is arranged on the side of the cathode 16 relative to the charge generation layer 15, into the light-emitting unit 14-2 by arranging an intermediate anode layer made of an organic material having the phthalocyanine skeleton (not shown) on the side of the cathode 16 relative to the intrinsic charge generation layer 15b.

As a consequence, according to display device 11' of the third embodiment, it becomes possible to make improvements in long-term reliability in the stacked display device 11', which is provided with the light-emitting units 14-1,14-2 formed of organic layers, respectively, and stacked one over the other, as in the first embodiment, and further, the fabrication of the stacked display device 11' excellent in long-term reliability as described above can be facilitated.

Even when the above-mentioned organic compound represented by the formula (1) is used as the intrinsic charge generation layer 15b in the charge generation layer 15', a charge injection efficiency of a similar level as in the conventional case making use of $V_2O_5$ is available. It is, therefore, possible to achieve a simplification of the layer structure as in the second embodiment.

Fourth Embodiment

Figure 4:
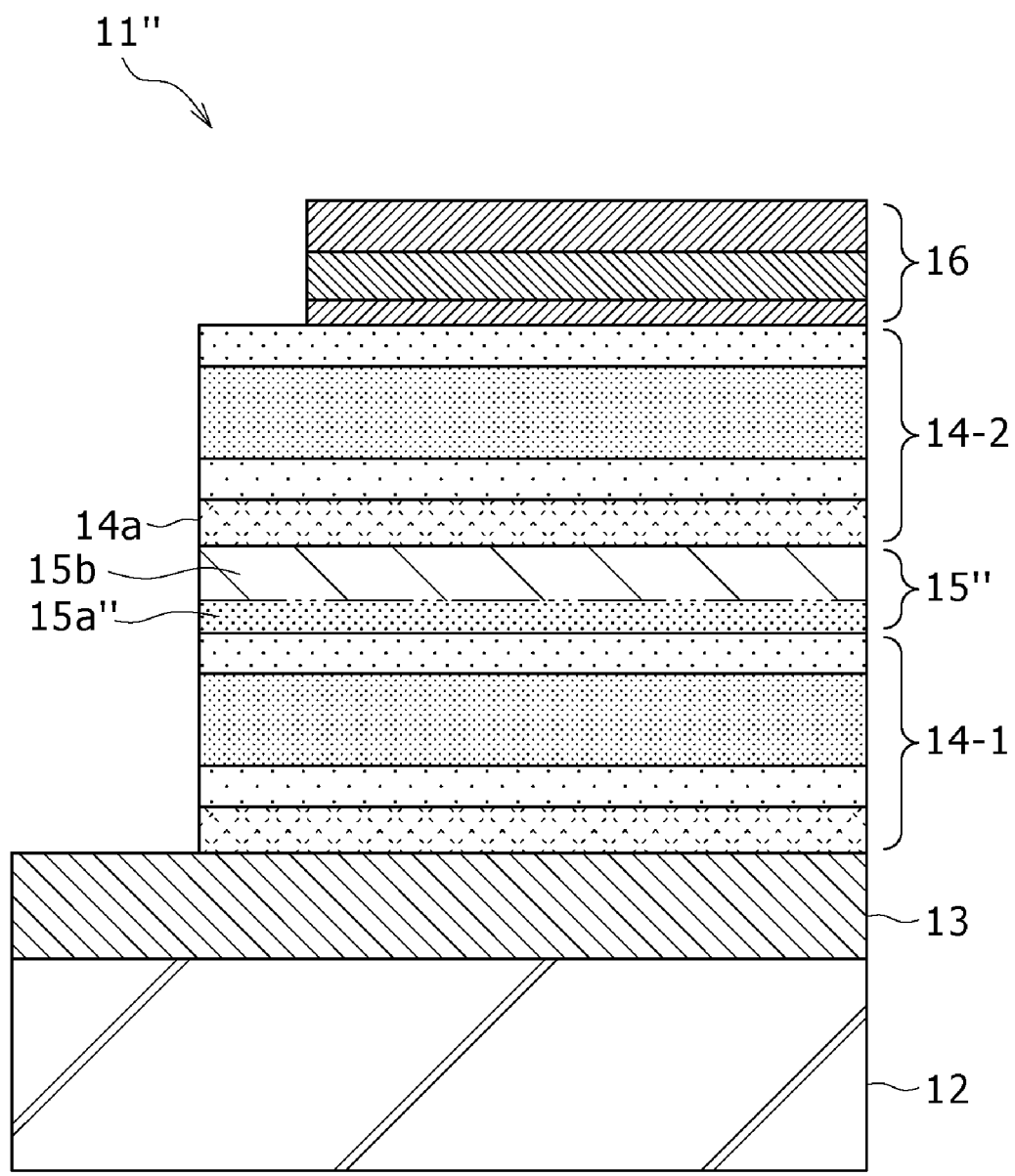
FIG. 4 is a cross-sectional view showing one construction example of a display device according to a fourth embodiment.

FIG. 4 is a cross-sectional view showing one construction example of a display device according to the fourth embodiment. A display device 11" shown in this drawing is different in the construction of a charge generation layer 15" from the display device 10 described with reference to FIG. 1, and in the remaining construction, they are supposed to be similar to each other. Centering around the charge generation layer 15", the construction of the display device 11" according to the fourth embodiment will hereinafter be described in detail.

Specifically, the charge generation layer 15" in the display device 11" according to the fourth embodiment has a construction that a mixed layer 15a" and an intrinsic charge generation layer 15b are stacked together in this order from the side of the anode 13. Because this interfacial layer 15a" acts as a cathode for the light-emitting unit 14-1 arranged in contact with the anode 13, this interfacial layer 15a" will hereinafter be referred to as "an intermediate cathode layer 15a"".

In the charge generation layer 15" of such a construction, the intermediate cathode layer (mixed layer) 15" is composed of a material obtained by mixing at least one element of alkali metals and alkaline earth metals with an organic material. Specific examples of the alkali metals and alkaline earth metals include lithium (Li), cesium (Cs), sodium (Na), potassium (K), rubidium (Rb), calcium (Ca), strontium (Sr), and barium (Ba). As the organic material which makes up the intermediate cathode layer (mixed layer) 15a", it is preferred to use an organic material equipped with electron-transporting property, for example, such as $Alq_3$ or ADN.

The intrinsic charge generation layer 15b is arranged in contact with this intermediate cathode layer (mixed layer) 15a", and has been formed using the organic compound represented by the formula (1).

Although an illustration is omitted in the drawing, the intermediate cathode layer 15a" may be in such a construction that a fluoride layer, which is formed of a fluoride containing at least one (at least one element) of alkali metals and alkaline earth metals, and the above-mentioned mixed layer are stacked one over the other in this order from the side of the anode 13.

As the intrinsic charge generation layer 15b has been formed using the organic compound represented by the formula (1) in the fourth embodiment, this intrinsic charge generation layer 15b may also serve as the hole injection layer 14a. It is, therefore, not necessary to provide the light-emitting unit 14-2, which is arranged on the side of the cathode 16 relative to the charge generation layer 15", with the hole injection layer 14a. Further, the charge generation layer 15" may be in such a construction that on the side of the cathode 16 relative to the intrinsic charge generation layer 15b, an intermediate anode layer composed of an organic material having the phthalocyanine skeleton such as copper phthalocyanine (CuPc) is stacked although an illustration is omitted in the drawing. With respect to the foregoing, the fourth embodiment is similar to the second embodiment.

Owing to the construction that in the display device 11" of the above-described construction according to the fourth embodiment, the charge generation layer 15"—which is formed of the mixed layer 15a" of at least one element of alkali metals and alkaline earth metals and an organic material and the intrinsic charge generation layer 15b formed of the organic compound represented by the formula (1), the mixed layer 15a" and the intrinsic charge generation layer 15b being stacked one over the other in contact with each other in the order from the side of the anode 13—is held between the light-emitting units 14-1 and 14-2, it has been confirmed that an emission of light is feasible at a sufficient efficiency of light emission in the stacked display device with the stacked light-emitting units. Moreover, the above-described materials which make up the charge generation layer 15" are both stable materials, so that the charge generation layer making us of the materials has been provided with stability.

As a consequence, according to the fourth embodiment, it becomes possible to make improvements in long-term reliability in the stacked display device 11", which is provided with the light-emitting units 14-1,14-2 formed of organic layers, respectively, and stacked one over the other, as in the second and third embodiments, and further, the fabrication of the stacked display device 11" excellent in long-term reliability as described above can be facilitated. Further, the use of the above-described organic compound represented by the formula (1) as the intrinsic charge generation layer 15b makes it possible to achieve a simplification of the layer structure.

It is to be noted that the display device according to the present invention as described above in each of the embodiments is not limited to a display device for use in an active matrix display making use of a TFT substrate but is also applicable as a display device for use in a passive display and can bring about a similar effect (improvements in long-term reliability).

In each of the above embodiments, the description was made about the "surface-emitting" case that light is outputted from the side of the cathode 16 arranged on a side opposite to the substrate 12. When the substrate 12 is composed of a transparent material, however, the present invention can also be applied to a "transmission" display device that light is outputted from the side of the substrate 12. In this case, in each of the stacked structures described with reference to FIG. 2 through FIG. 4, the anode 13 on the substrate 12 made of the transparent material is formed using a transparent electrode material having a large work function, for example, such as ITO. As a result, light is outputted from both of the side of the substrate 12 and the side opposite to the substrate 12. By forming the cathode 16 with a reflecting material in such a construction, light is outputted only from the side of the substrate 12. In this case, a sealing electrode of AuGe, Au, Pt or the like may be applied as a top layer in the cathode 16.

Further, even with a construction that in each of the stacked structures described with reference to FIG. 1 through FIG. 4, the individual layers were stacked one over another in a reverse order from the side of the substrate 12 made of the transparent material to arrange the anode 13 as an upper electrode, a "transmission" display device that light is outputted from the side of the substrate 12 can be formed. Even in this case, light can be outputted from both of the side of the substrate 12 and the side opposite to the substrate 12 by changing the anode 13, which becomes the upper electrode, into a transparent electrode.

Other Embodiments

The above-described display devices of the first to fourth embodiments can each be combined with color changing films. Taking as an example the display device of FIG. 1 described in connection with the first embodiment, a description will hereinafter be made of the construction of a display device making use of color changing films. It is, however, to be noted that the color changing films are equally applicable to the display devices of the second to fourth embodiments.

Figure 5:
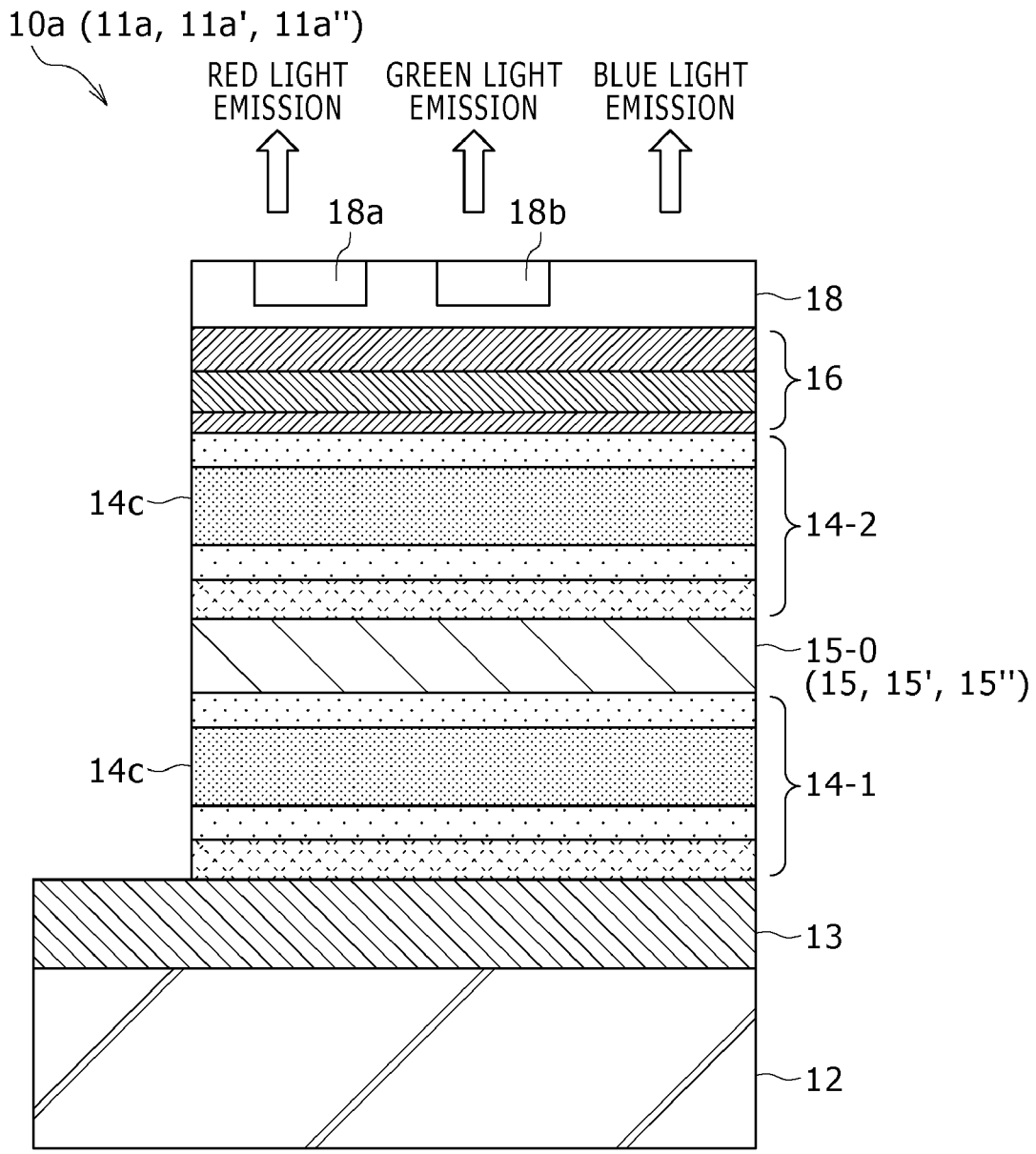
FIG. 5 is a cross-sectional view depicting a first example of a combination of the display device according the embodiment and color changing films.

Firstly, FIG. 5 depicts a display device 10a in which the display device 10 described in connection with the first embodiment is of the "surface-emitting" type that light is outputted from a side opposite to the substrate 12. In this case, the display device 10a is constructed with a color changing layer 18 arranged over the cathode 16 which becomes a light-outputting side. If the light-emitting layer 14c is an excitation light source of the blue color wavelength, color changing films 18a, which change the excitation light source of the blue color wavelength into the red color wavelength, and color changing films 18b, which change the excitation light source of the blue color wavelength into the green color, are arranged corresponding to the individual pixel areas in the color changing layer 18. At portions of the color changing layer 18 other than the color changing films 18a and the color changing films 18b, there are arranged films of a material that permits the transmission of the excitation light source of the blue wavelength without changing its wavelength. With the display device 10a of the above-described construction, a full-color display can be performed.

The color changing layer 18 equipped with the color changing films 18a,18b of such constructions can be formed using photolithography, a known technology.

Figure 6:
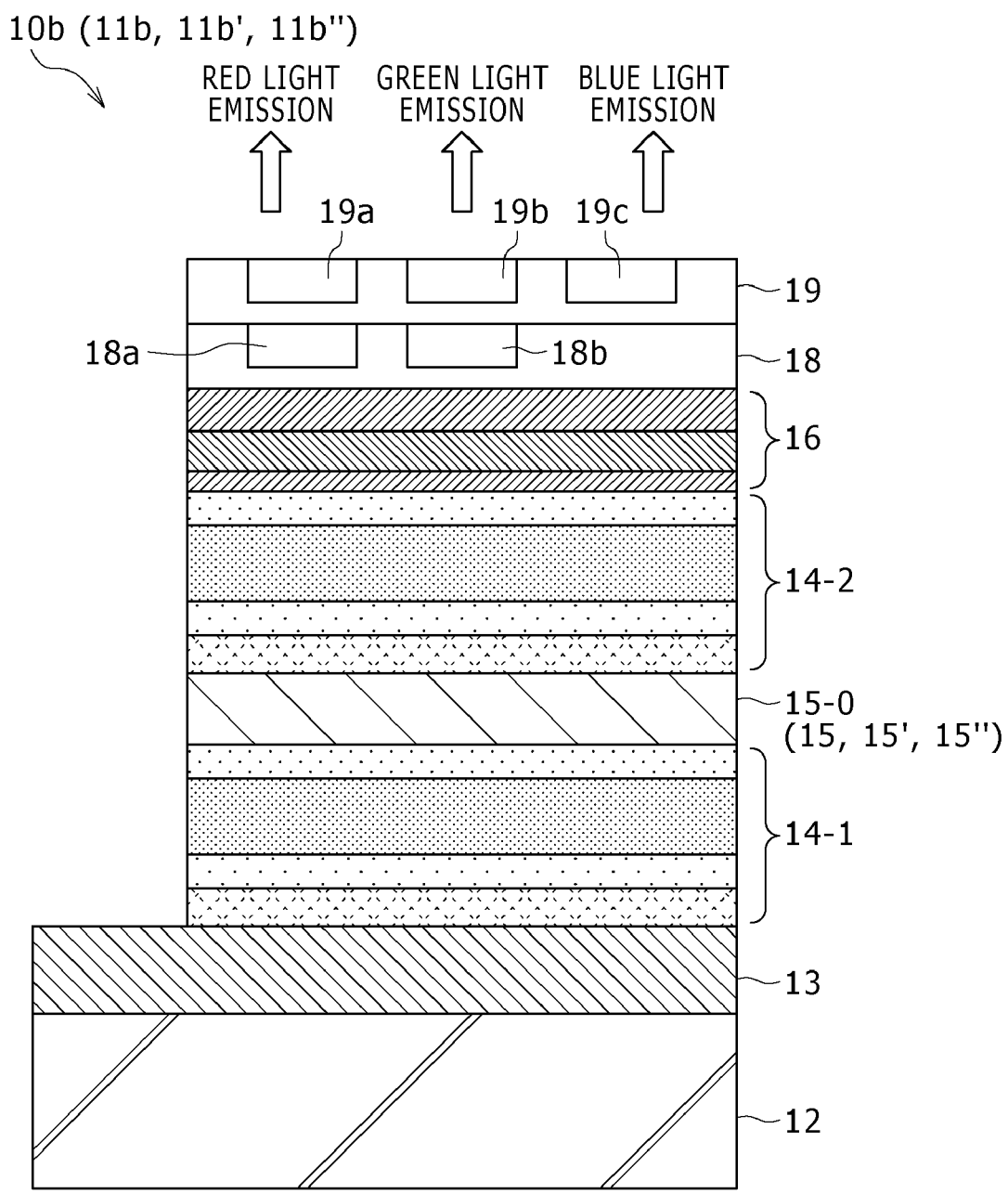
FIG. 6 is a cross-sectional view depicting a second example of the combination of the display device according the embodiment and the color changing films.

FIG. 6 depicts another display device 10b in which the display (10) described in connection with the first embodiment is of "the surface-emitting type". As depicted in the drawing, color changing layers 18,19 may be arranged in a form stacked one over the other over the cathode 16 which becomes a light-outputting side. In the case, corresponding to individual pixel areas, color changing films 18a,19a which change the excitation light source of the blue color wavelength into the red color wavelength are arranged in a form stacked one over the other, and color changing films 18b,19b which change the excitation light source of the blue color wavelength into the green color wavelength are arranged in a form stacked one over the other. These color changing films 18a,19a and color changing films 18b,19b arranged in the stacked forms are, owing to their use in the stacked forms, supposed to be in such a combination that light transmitted through both of them is changed to a desired wavelength. It is also possible to further arrange a color changing film 19c which changes the excitation light source of the blue wavelength into a blue color of still better chromaticity. At portions of the color changing layer 19 other than the color changing films 19a to 19c, there are arranged films of a material that permits the transmission of the excitation light source of the blue wavelength without changing its wavelength. Even with the display device 10b of the above-described construction, a full-color display can also be performed.

Figure 7:
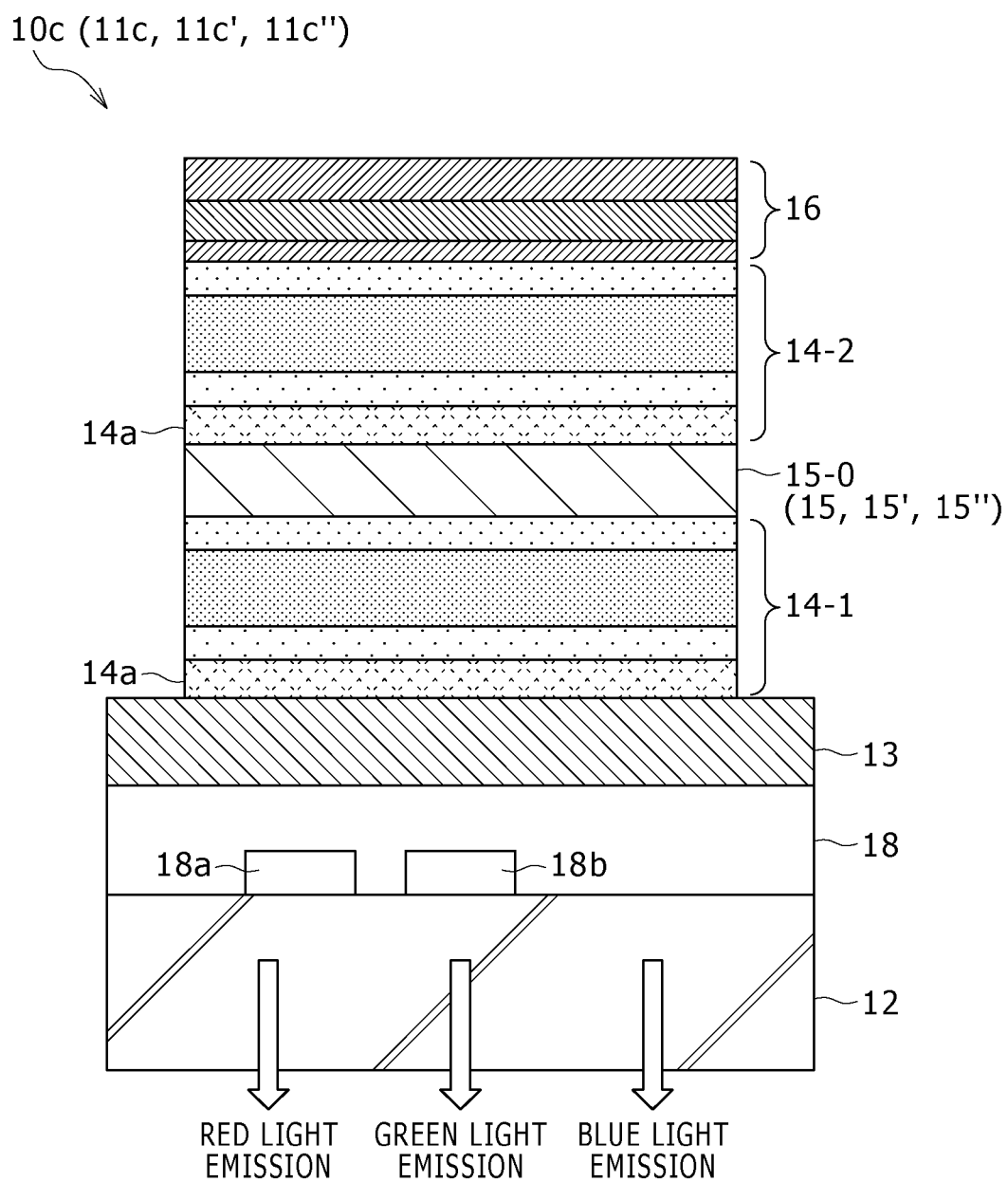
FIG. 7 is a cross-sectional view depicting a third example of the combination of the display device according the embodiment and the color changing films.

FIG. 7 depicts a display device 10c in which the display device (10) described in connection with the first embodiment is of "the transmission type" that light is outputted from the side of the substrate 12. In this case, the display device 10c is constructed with a color changing layer 18 arranged between the anode 13 and the substrate 12, both of which are on the light-outputting side. The construction of the color changing layer 18 is similar to that mentioned above. Even with the color display 10c of the above-described construction, a full-color display can also be performed.

Figure 8:
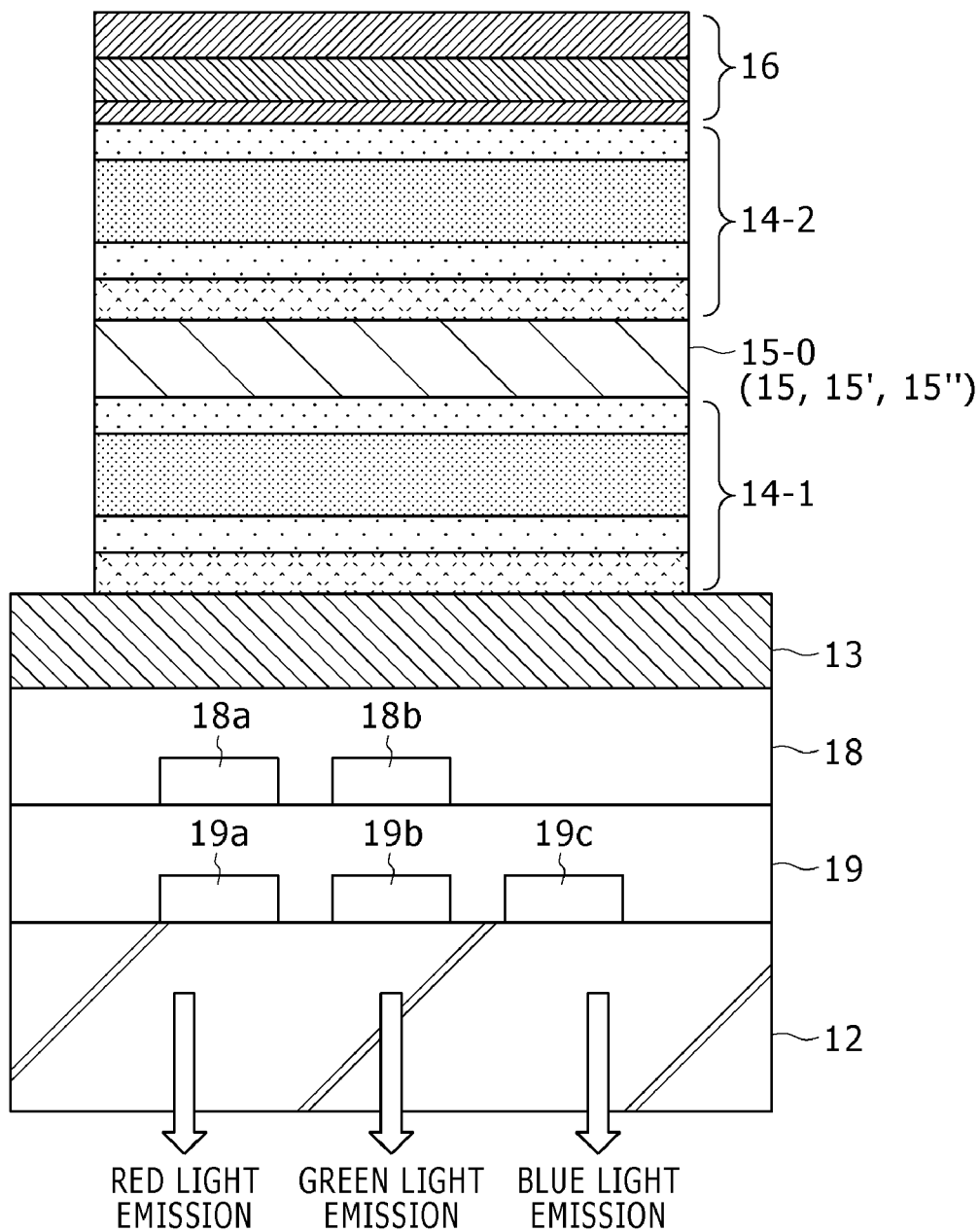
FIG. 8 is a cross-sectional view depicting a fourth example of the combination of the display device according the embodiment and the color changing films.

FIG. 8 depicts a still further color display 10d in which the display device (10) described in connection with the first embodiment is of "the transmission type". As depicted in the drawing, color changing layers 18,19 may be arranged in a form stacked one over the other between the anode 13 and the substrate 12, which are on the light-outputting side. The constructions of the color changing layers 18,19 are similar to those mentioned above. Even with the color display 10d of the above-described construction, a full-color display can also be performed.

By changing the charge generation layers 15-0 to the charge generation layers 15, 15', 15", . . . of the constructions described above in connection with the second to fourth embodiments, respectively, in the construction of the display devices 10a to 10c described above with reference to FIG. 5 through FIG. 8, display devices 11a, 11a', 11a", . . . corresponding to the respective embodiments can be constructed.

EXAMPLES

A description will next be made of the fabrication procedures of display devices of specific examples of the present invention and comparative examples corresponding to these examples, and their assessment results. In Examples 1 to 4 to be described below, the fabrication of individual display devices 10 according to the first embodiment shown in FIG. 1 will be described with reference to Table 8. In Examples 5 to 20 to be described below, the fabrication of individual display devices 11 according to the second embodiment shown in FIG. 2 will be described with reference to Table 9. In Examples 21 to 24, the fabrication of individual display devices 11' according to the third embodiment shown in FIG. 3 will be described with reference to Table 10. In Examples 25 to 36, the fabrication of individual display devices 11" according to the fourth embodiment shown in FIG. 4 will be described with reference to Table 11. Further, in Examples 37 to 58, the fabrication of individual display devices 10a of the construction depicted in FIG. 5 will be described with reference to Table 12 to Table 14. The fabrication and assessment results in each comparative example will be described either before or after the description of the corresponding example.

Examples 1 to 4

In Examples 1 to 4, display devices 10 were fabricated, respectively, with a similar construction as the display device 10 of the first embodiment described with reference to FIG. 1 except that charge generation layers 15-0 were formed with the corresponding materials into the corresponding stacked structures. Firstly, a description will hereinafter be made of the fabrication procedure of each of the display devices 10 of Examples 1 to 4.

On a substrate 12 formed of a 30 mm×30 mm glass plate, ITO was formed as an anode 13 (to thickness of about 120 nm), and by SiO$_2$ evaporation, and the ITO film was masked with an insulating film (not shown) at an area other than a 2 mm×2 mm light-emitting area to prepare a cell for an organic electroluminescent device.

As a hole injection layer 14a adapted to form a light-emitting unit 14-1 as a first layer, a hole injection material of the structural formula (1)-10, an azatriphenylene organic material, was then deposited at a film thickness of 15 nm (deposition rate: 0.2 to 0.4 nm/sec) by vacuum evaporation.

Subsequently, as a hole transport layer 14b, α-NPD (bis [N-(1-naphthyl)-N-phenyl]bendizine) represented by the below-described structural formula (2) was deposited at a film thickness of 15 nm (deposition rate: 0.2 to 0.4 nm/sec) by vacuum evaporation.

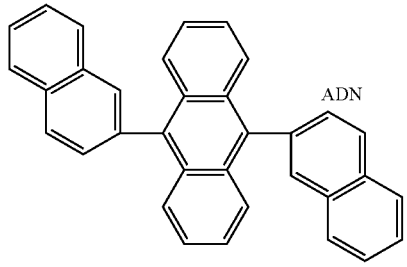

Structural formula (3)

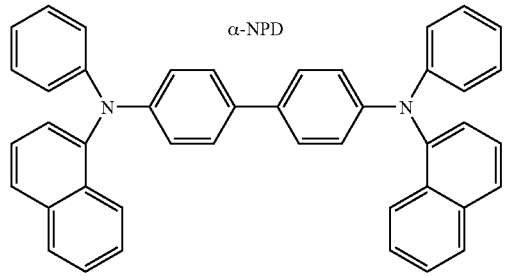

Structural formula (2)

Finally, as an electron transport layer 14d, Alq$_3$ [tris(8-hydroxyquinolinato)aluminum(III)] represented by the below-described structural formula (4) was deposited at a film thickness of 18 nm by vacuum evaporation.

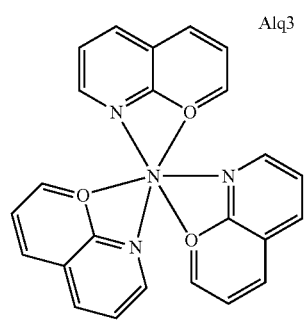

Structural formula (4)

Further, using ADN represented by the below-described structural formula (3) as a host and "BD-052x" (Idemitsu Kosan Co., Ltd.; trade name) as a dopant, those materials were formed as a light-emitting layer 14c into a film of 32 nm thickness in total by vacuum evaporation such that the light-emitting layer 14c accounted for 5% in terms of film thickness percentage.

After light-emitting units 14-1 had been formed as first layers as described above, the materials shown below in Table 8 were evaporated and deposited as charge generation layers 15-0 at the corresponding film thicknesses, respectively.

TABLE 8

| | Display devices 10 | | | | |
| --- | --- | --- | --- | --- | --- |
| | Charge generation layer 15-0 | | | | |
| | First layer | Film thickness (Å) | Second layer | Film thickness (Å) | Q/Y(cd/A) |
| Ex. 1 | Li$_2$SiO$_3$ | 15 | — | — | 7.98 |
| Ex. 2 | Li$_2$SiO$_3$ + STRUCTURAL FORMULA (1) 10 | 15 | — | — | 7.98 |
| Ex. 3 | Li$_2$SiO$_3$ + STRUCTURAL FORMULA (1) 10 | 30 | — | — | 7.75 |
| Ex. 4 | Li$_2$SiO$_3$ | 15 | Li$_2$SiO$_3$ + STRUCTURAL FORMULA (1) 10 | 15 | 8.11 |
| Comp. Ex. 1 | Li$_2$SiO$_3$ | 15 | V$_2$O$_5$ | 20 | 8.24 |
| Comp. Ex. 2 | Li$_2$SiO$_3$ | 15 | V$_2$O$_5$ | 15 | 8.13 |
| Comp. Ex. 3 | Li$_2$SiO$_3$ | 15 | V$_2$O$_5$ | 10 | 7.95 |
| Comp. Ex. 4 | Li$_2$SiO$_3$ | 15 | V$_2$O$_5$ | 5 | 7.59 |
| Comp. Ex. 5 | — | — | — | — | 5.67 |
| Comp. Ex. 6 | | | Mono unit type | | 5.23 |

In Example 1, $Li_2SiO_3$ was deposited at a film thickness of 15 Å to form a charge generation layer 15-0 of a single layer structure. In Examples 2 and 3, $Li_2SiO_3$ and STRUCTURAL FORMULA (1)-10, a hole injection material, were coevaporated to form at the respective film thicknesses charge generation layers 15-0 of a single-layer structure which were composed of mixed layers, respectively. The composition was set at $Li_2SiO_3$: STRUCTURAL FORMULA (1)-10=4:1 (film thickness ratio). In Example 4, a charge generation layer 15-0 was formed with a second layer formed of a mixed layer of $Li_2SiO_3$: STRUCTURAL FORMULA (1)-10=4:1 (film thickness ratio) and stacked over a first layer composed of $Li_2SiO_3$.

After the foregoing procedure, light-emitting units 14-2 were formed as second layers in a similar manner as the light-emitting units 14-1 as the first layers.

As first layers 16a in cathodes 16, LiF was then formed at a film thickness of about 0.3 nm by vacuum evaporation (deposition rate: 0.01 nm/sec or less). Subsequently, as second layers 16b, MgAg was formed at a film thickness of 10 nm by vacuum deposition. Finally, as third layers 16c, Al was formed at a film thickness of 300 nm.

Comparative Examples 1 to 4

Display devices were fabricated with a similar construction as the display device described with reference to FIG. 1 except that the construction of the charge generation layer 15-0 was changed to the constructions shown above in Table 8, respectively. The fabrication procedure of the above-described examples was followed except that only the formation step of the charge generation layer 15-0 was changed. In the formation step of the charge generation layer 15-0 in each of Comparative Examples 1 to 4, a first layer of $Li_2SiO_3$ (film thickness: 15 Å) was firstly formed, and over the first layer, a second layer of $V_2O_5$ was then formed at the corresponding thickness.

Comparative Example 5

A display device was fabricated with a similar construction as the display device described with reference to FIG. 1 except that a light-emitting unit 14-1 was arranged over an anode 13, a light-emitting unit 14-2 was directly stacked without the interposition of the charge generation layer 15-0, and a cathode 16 was arranged over the light-emitting unit 14-2. The fabrication procedure of the above-described examples was followed except for the omission of only the formation of the charge generation layer 15-0.

Comparative Example 6

A mono unit display device was fabricated with a similar construction as the display device described above with reference to FIG. 1 except that a light-emitting unit 14-1 is arranged over an anode 13 and a cathode 16 is arranged directly over the light-emitting unit 14-1. The fabrication procedure of the above-described examples was followed except that only the anode 13, light-emitting unit 14-1 and cathode 16a were formed likewise.

<<Assessment Results—1>>

In Table 8, the efficiencies of light emission (Quantum Yield: Q/Y) of the display devices of Examples 1 to 4 and Comparative Examples 1 to 6 fabricated as described above are also shown. As indicated by the results, the display devices of Examples 1 to 4 were all improved in the efficiency of light emission over the mono unit structure of Comparative Example 6, so that the effect of the stacked charge generation layer 15-0 in the present invention has been confirmed.

Comparative Examples 1 to 4 brought about substantially the equal advantageous effect as Example 1 to 4, but compared with Examples 1 to 4, the drive voltage was higher and the IV characteristic shifted to a higher voltage side. This suggests that in these comparative examples making use of $V_2O_5$ commonly employed as conventional charge generation layers, power consumption takes place in the charge generation layer 15-0. It has, therefore, been confirmed that the drive voltage can be effectively lowered by constructing the charge generation layer 15-0 with $Li_2SiO_3$ as a principal component without using $V_2O_5$.

Comparative Example 5 in which the light-emitting units 14-1,14-2 were stacked one over the other without the interposition of any charge generation layer has substantially the same efficiency of light emission as Comparative Example 6, thereby indicating the need for the charge generation layer 15-0.

In Examples 1 to 4, it was possible to readily conduct the fabrication of the individual display devices by using only the stable materials without carrying out the formation of a film of a strict stoichiometric composition as required especially when unstable materials are used.

Examples 5 to 16

In Examples 5-16, display devices 11 were fabricated, respectively, with a similar construction as the display device 11 of the second embodiment described with reference to FIG. 2 except that charge generation layers 15 were formed with the corresponding materials into the corresponding stacked structures. Firstly, a description will hereinafter be made of the fabrication procedure of each of the display devices 11 of Examples 5-16.

On a substrate 12 formed of a 30 mm×30 mm glass plate, ITO was formed as an anode 13 (to thickness of about 120 nm), and by $SiO_2$ evaporation, and the ITO film was masked with an insulating film (not shown) at an area other than a 2 mm×2 mm light-emitting area to prepare a cell for an organic electroluminescent device.

As a hole injection layer 14a adapted to form a light-emitting unit 14-1 as a first layer, a hole injection material, "HI-406" (product of Idemitsu Kosan Co., Ltd.), was then deposited at a film thickness of 15 nm (deposition rate: 0.2 to 0.4 nm/sec) by vacuum evaporation.

Subsequently, as a hole transport layer 14b, α-NPD (bis [N-(1-naphthyl)-N-phenyl]bendizine) represented by the above-described structural formula (2) was deposited at a film thickness of 15 nm (deposition rate: 0.2 to 0.4 nm/sec) by vacuum evaporation.

Further, using ADN represented by the above-described structural formula (3) as a host and "BD-052x" (Idemitsu Kosan Co., Ltd.; trade name) as a dopant, those materials were formed into a film of 32 nm thickness in total by vacuum evaporation such that the light-emitting layer 14c accounted for 5% in terms of film thickness percentage.

Finally, as an electron transport layer 14d, $Alq_3$ [tris(8-hydroxyquinolinato)aluminum(III)] represented by the above-described structural formula (4) was deposited at a film thickness of 18 nm by vacuum evaporation.

After light-emitting units 14-1 had been formed as first layers as described above, the materials shown below in Table 9 were evaporated and deposited as charge generation layers 15 at the corresponding film thicknesses, respectively.

TABLE 9

Display devices 11

Charge generation layer 15

| | Intermediate cathode layer 15a | Film thickness (Å) | Intrinsic charge generation layer 15b | Film thickness (Å) | Intermediate anode layer | Film thickness (Å) |
|---|---|---|---|---|---|---|
| Transmission type | | | | | | |
| Ex. 5 | $Li_2SiO_3$ | 15 | $V_2O_5$ | 120 | — | — |
| Ex. 6 | $LiAlO_2$ | 15 | $V_2O_5$ | 120 | — | — |
| Ex. 7 | $Li_2MoO_4$ | 15 | $V_2O_5$ | 120 | — | — |
| Ex. 8 | $LiTaO_3$ | 15 | $V_2O_5$ | 120 | — | — |
| Ex. 9 | $Li_2TiO_3$ | 15 | $V_2O_5$ | 120 | — | — |
| Ex. 10 | $Li_2ZrO_3$ | 15 | $V_2O_5$ | 120 | — | — |
| Ex. 11 | $Cs_2CO_3$ | 15 | $V_2O_5$ | 120 | — | — |
| Ex. 12 | $MgIn_2O_4$ | 15 | $V_2O_5$ | 120 | — | — |
| Ex. 13 | $Li_2O$ | 15 | $V_2O_5$ | 120 | — | — |
| Ex. 14 | $Li_2SiO_3$ | 15 | $V_2O_5$ | 120 | CuPc | 20 |
| Ex. 15 | $Li_2SiO_3$ | 15 | Structural formula (1)-10 | 120 | — | — |
| Ex. 16 | $Li_2CO_3$ | 15 | Structural formula (1)-10 | 120 | — | — |
| Without the hole injection layer 14a (the light-emitting unit 14-2) | | | | | | |
| Ex. 17 | $Li_2SiO_3$ | 10 | Structural formula (1)-10 | 50 | — | — |
| Ex. 18 | $Li_2SiO_3$ | 15 | Structural formula (1)-10 | 120 | — | — |
| Surface-emitting type | | | | | | |
| Ex. 19 | $Li_2SiO_3$ | 15 | $V_2O_5$ | 120 | — | — |
| Ex. 20 | $Li_2O$ | 15 | $V_2O_5$ | 120 | — | — |

In Examples 5 to 16, the corresponding materials shown above in Table 9 were firstly deposited at a film thickness of 15 Å as intermediate cathode layers 15a in charge generation layers 15, respectively.

In Examples 5 to 14, $V_2O_5$ was then evaporated and deposited as intrinsic charge generation layers 15b at a film thickness of 120 Å. In Examples 15 and 16, on the other hand, the organic compound represented by the above-described structural formula (1)-10 was deposited as intrinsic charge generation layers 15b at a film thickness of 120 Å.

Further, only in Example 14, copper phthalocyanine (CuPc) was further deposited as an intermediate anode layer (not shown) at a film thickness of 20 Å.

After the foregoing procedure, light-emitting units 14-2 were formed as second layers in a similar manner as the light-emitting units 14-1 as the first layer.

As first layers 16a of cathodes 16, LiF was then formed at a film thickness of about 0.3 nm by vacuum evaporation (deposition rate: 0.01 nm/sec or less). Subsequently, as second layers 16b, MgAg was formed at a film thickness of 10 nm by vacuum deposition. Finally, as third layers 16c, Al was formed at a film thickness of 300 nm. As a results, transmission display devices 11 that light is outputted form the side of the substrates 12 were obtained.

Examples 17 and 18

In Examples 17 and 18, display devices were fabricated with a similar construction as the construction of Example 15 except that the organic compound of the structural formula (1)-10 in Table 1 was deposited in place of "HI-406" at a film thickness of 15 nm as hole injection layers 14a in light-emitting units 14-1 as first layers, no hole injection layers 14a were formed in light-emitting units 14-2 as a second layers, and intrinsic charge generation layers 15b composed of the first structural formula (1)-10 were also used commonly as hole injection layers for the light-emitting units 14-2. However, the charge generation layers 15 were constructed at the respective film thicknesses shown in Table 9.

Examples 19 and 20

In Examples 19 and 20, surface-emitting display devices were fabricated with a similar construction as the display device 11 of the first embodiment described with reference to FIG. 2 except that light was outputted from the side opposite to substrates 12. In the above-described fabrication procedure of Examples 5 to 16, a silver alloy was deposited as anodes 13 (film thickness: about 100 nm) instead of ITO, and in lieu of Al, IZO (indium-zinc complex oxide) was deposited at 200 nm as third layers 16c in cathodes 16. As shown in Table 9, a charge generation layer 15 in Example 19 was formed as in Example 5, and a charge generation layer 15 in Example 20 was formed as in Example 13.

Examples 21 and 22

In Examples 21 and 22, display devices 11' were fabricated with a similar construction as the display device 11' of the third embodiment described with reference to FIG. 3 except that charge generation layers 15' were formed in the corresponding stacked structures with the corresponding materials. In these Examples 21 and 22, the transmission display devices 11' were fabricated by a similar procedure as in Examples 5-16 except that in the above-described fabrication procedure of Examples 5 to 16, the construction of the charge generation layer 15' was changed to the constructions shown below in Table 10, respectively. Described specifically, in each of Examples 21 and 22, the charge generation layer 15' was formed in a three-layer structure, and over a fluoride layer 15a-1 made of LiF, a conducting material layer 15a-2 formed of an MgAg (composition=10:1) film was stacked, followed by further stacking of an intrinsic charge generation layer 15b made of $V_2O_5$. The thicknesses of the respective films are shown in Table 10.

TABLE 10

Display devices 11'

| | Intermediate cathode layer 15a' | | | | |
|---|---|---|---|---|---|
| Fluoride layer 15a-1 | Film thickness (Å) | Conducting material layer 15a-2 | Film thickness (Å) | Intrinsic charge generation layer 15b | Film thickness (Å) |

| Charge generation layer 15' | | | | | |
|---|---|---|---|---|---|
| Transmission type | | | | | |
| Ex. 21 | LiF | 4 | MgAg | 50 | $V_2O_5$ | 120 |
| Ex. 22 | LiF | 15 | MgAg | 50 | $V_2O_5$ | 120 |
| Surface-emitting type | | | | | | |
| Ex. 23 | LiF | 4 | MgAg | 50 | $V_2O_5$ | 120 |
| Ex. 24 | LiF | 15 | MgAg | 50 | $V_2O_5$ | 120 |

| Comparative examples | Charge generation layer | | | | | |
|---|---|---|---|---|---|---|
| Comp. Ex. 7 | Mono unit type | | | | | |
| Comp. Ex. 8 | — | — | — | — | — | — |
| Comp. Ex. 9 | — | — | — | — | $V_2O_5$ | 120 |
| Comp. Ex. 10 | LiF | 4 | — | — | $V_2O_5$ | 120 |
| Comp. Ex. 11 | LiF | 15 | — | — | $V_2O_5$ | 120 |
| Comp. Ex. 12 | Surface-emitting type of Comparative Example 7 | | | | | |

Examples 23 and 24

In Examples 23 and 24, face-emitting display devices were fabricated with a similar construction as the display device 11' of the third embodiment described with reference to FIG. 3 except that light was outputted from the side opposite to substrates 12. In the above-described fabrication procedure of Examples 21 and 22, a silver alloy was deposited as anodes 13 (film thickness: about 100 nm) instead of ITO, and in lieu of Al, IZO (indium-zinc complex oxide) was deposited at 200 nm as third layers 16c in cathodes 16. As shown in Table 10, a charge generation layer 15' in Example 23 was formed as in Example 21, and a charge generation layer 15' in Example 23 was formed as in Example 22.

Comparative Example 7

A mono unit display device was fabricated with a similar construction as the display device described above with reference to FIG. 3 except that a light-emitting unit 14-1 is arranged over an anode 13 and a cathode 16 is arranged directly over the light-emitting unit 14-1. The above-described fabrication procedure of Examples 5 to 16 was followed except that only the anode 13, light-emitting unit 14-1 and cathode 16 were formed likewise.

Comparative Example 8

A display device was fabricated with a similar construction as the display device described with reference to FIG. 3 except that a light-emitting unit 14-1 was arranged over an anode 13, a light-emitting unit 14-2 was directly stacked without the interposition of the charge generation layer 15', and a cathode 16 was arranged over the light-emitting unit 14-2. The above-described fabrication procedure of Examples 5 to 16 was followed except for the omission of only the formation of the charge generation layer 15.

Comparative Examples 9 to 11

Display devices were fabricated with a similar construction as the display device described with reference to FIG. 3 except that the construction of the charge generation layer 15' was changed to the constructions shown above in Table 10, respectively. The above-described fabrication procedure in Examples 5 to 16 was followed likewise. In Comparative Example 9, however, $V_2O_5$ was evaporated and deposited only as an intrinsic charge generation layer 15b at a film thickness of 120 Å in the formation of a charge generation layer 15'. In the formation of charge generation layers 15' in Comparative Examples 10 and 11, LiF was formed at the corresponding film thicknesses as intermediate cathode layers 15a', and $V_2O_5$ was then evaporated and deposited only as intrinsic charge generation layers 15b at a film thickness of 120 Å.

Comparative Example 12

A surface-emitting display device was fabricated with a similar construction as the mono unit display device fabricated in Comparative Example 7 except that light was outputted from the side opposite to a substrate 12. The display device was fabricated by a similar procedure as the fabrication procedure of the display device described in Comparative Example 7 except that an Ag alloy was deposited as an anode (film thickness: about 100 nm) and IZO (indium-zinc complex oxide) was deposited at 200 nm as a third layer 16c in a cathode 16.

<<Assessment Results—2>>

Figure 9:
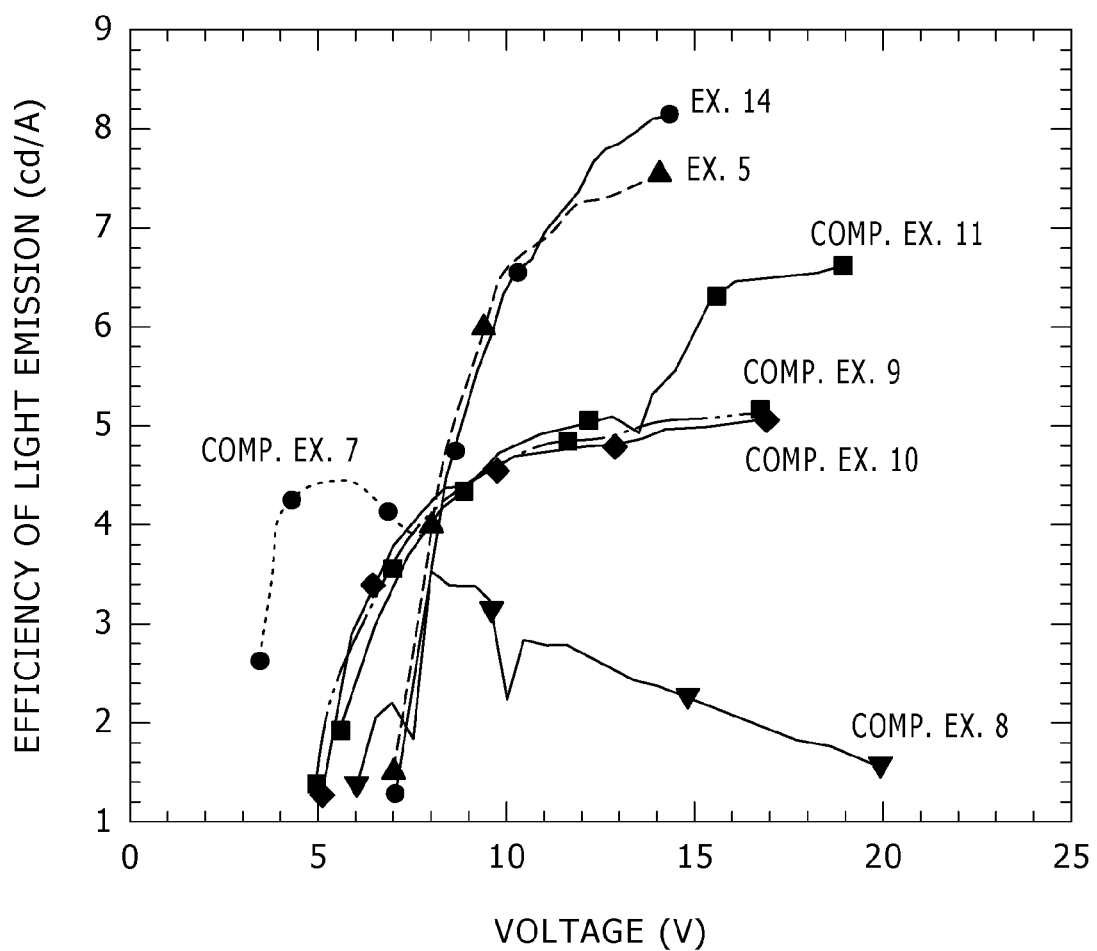
FIG. 9 is a diagrammatic representation illustrating the efficiencies of light emission by display devices of Examples 5 and 14 and Comparative Examples 7 to 11.

FIG. 9 illustrates the efficiencies of light emission by the display devices of Examples 5 and 14 and Comparative Examples 7 to 11 fabricated as described above. As shown in this diagrammatic representation, the efficiencies of light emission by the display devices of Examples 5 and 14 were twice as high as that of the mono unit light-emitting device of Comparative Example 7. In Examples 6 to 13 and 15 to 24, the efficiencies of light emission were also twice as high as that of the mono unit light-emitting device of Comparative Example 7 owing to use of the transmission or surface-emitting construction, especially the use of the organic compound of the structural formula (1) as in Examples 15 and 16 despite the construction that the hole injection layer 14a was omitted in some of the examples. Accordingly, the effects of the charge generation layer 15 or 15' in the present invention as formed in the stacked construction have been confirmed.

Especially in Example 14 that the charge generation layer 15 had the intermediate anode layer (CuPc) at its interface on the side of the cathode 16, the efficiency of light emission was determined to increase further in comparison with the other examples. Accordingly, the arrangement of such an intermediate anode layer has been confirmed to make an improvement in the efficiency of hole injection into the light-emitting unit 14-2 arranged on the side of the cathode 16 relative to the charge generation layer 15.

With the display device of Comparative Example 8 in the construction that the light-emitting units were stacked directly one over the other, it was unable to obtain any efficiency of light emission higher than that of the mono unit type of Comparative Example 7. The need for the charge generation layer 15(15') has been demonstrated accordingly. With the display device of Comparative Example 9 in the construction that the charge generation layer formed of the single $V_2O_5$ layer was used, it was unable to effectively inject electrons and holes from the charge generation layer into the electron transport layer 14d and the hole injection layer 14a, respectively, so that the efficiency of light emission obtained was as low as that of Comparative Example 1.

Concerning Comparative Examples 10 and 11, it was unable to perform any good injection of electrons although the fluoride layer (LiF) 15a-1 was stacked directly on the intrinsic charge generation layer ($V_2O_5$) 15b. It has, therefore, been demonstrated that the interposition of the conducting material layer (MgAg or the like) 15a-2 as in Example 21 and 22 makes it possible to effectively perform the injection of electrons.

From the results of Comparative Example 11, it is presumed that, as the drive voltage is progressively raised, the charge generation layer 15 is destructed at its interface and the efficiency increases abruptly. This also suggests that no efficient electron injection is performed with the construction that the fluoride layer (LiF) 15a-1 is stacked directly on the intrinsic charge generation layer ($V_2O_5$) 15b. The effect of the arrangement of the conducting material layer (MgAg or the like) 15a-2 between these layers has been confirmed accordingly.

In Examples 5 to 24, it was possible to readily conduct the fabrication of the individual display devices by using only the stable materials without carrying out the formation of a film of a strict stoichiometric composition as required especially when unstable materials are used.

<<Assessment Results—3>>

Figure 10:
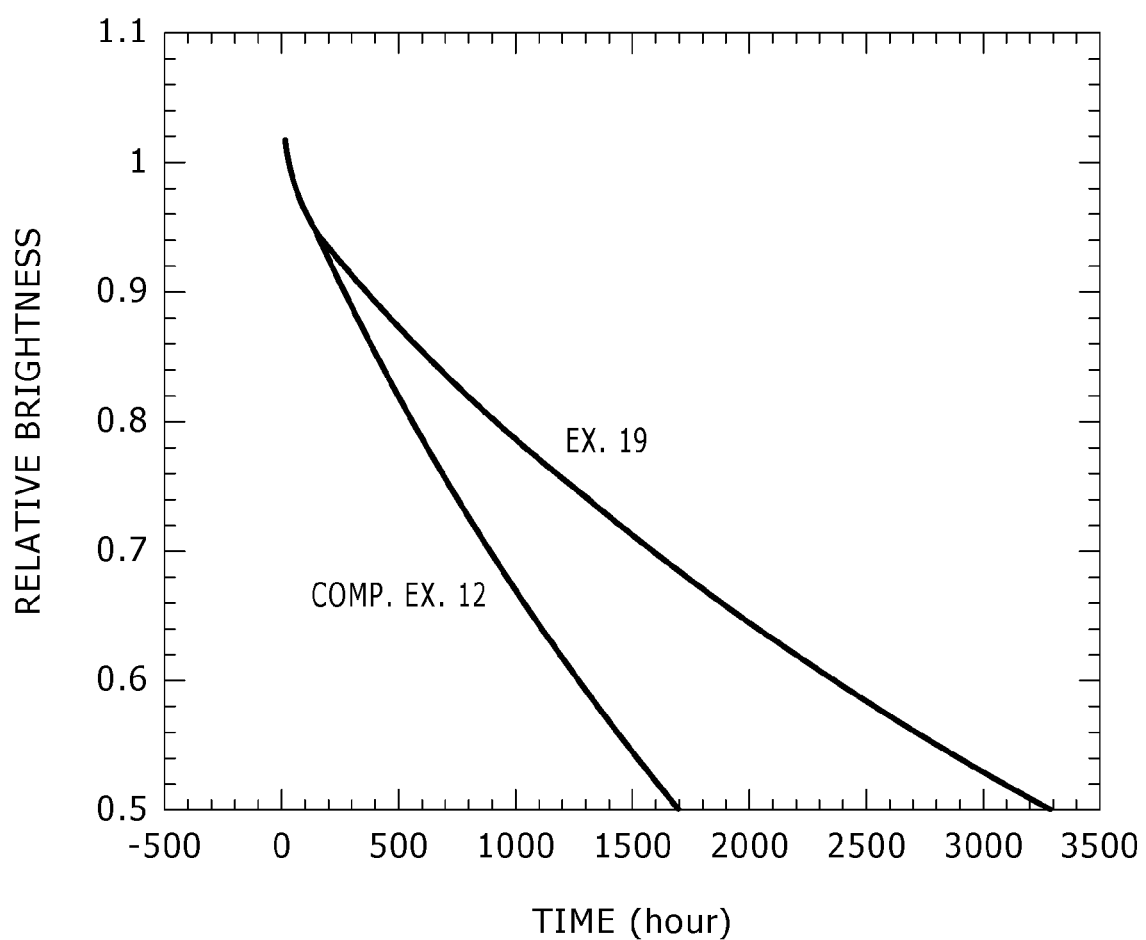
FIG. 10 is a diagrammatic representation illustrating time-dependent variations in relative brightness of display devices of Example 19 and Comparative Example 12.

FIG. 10 illustrates the results of lifetime measurements conducted with the initial brightness set at 3,000 cd/m² on the display devices of Example 19 and Comparative Example 12 fabricated as described above. From the results, it has been confirmed that even between the surface-emitting device constructions, the stacked display device fabricated in Example 19 was substantially improved in half lifetime over the mono unit display device of Comparative Example 12 and is effective for the improvement of long-term reliability.

<<Assessment Results—4>>

Figure 11:
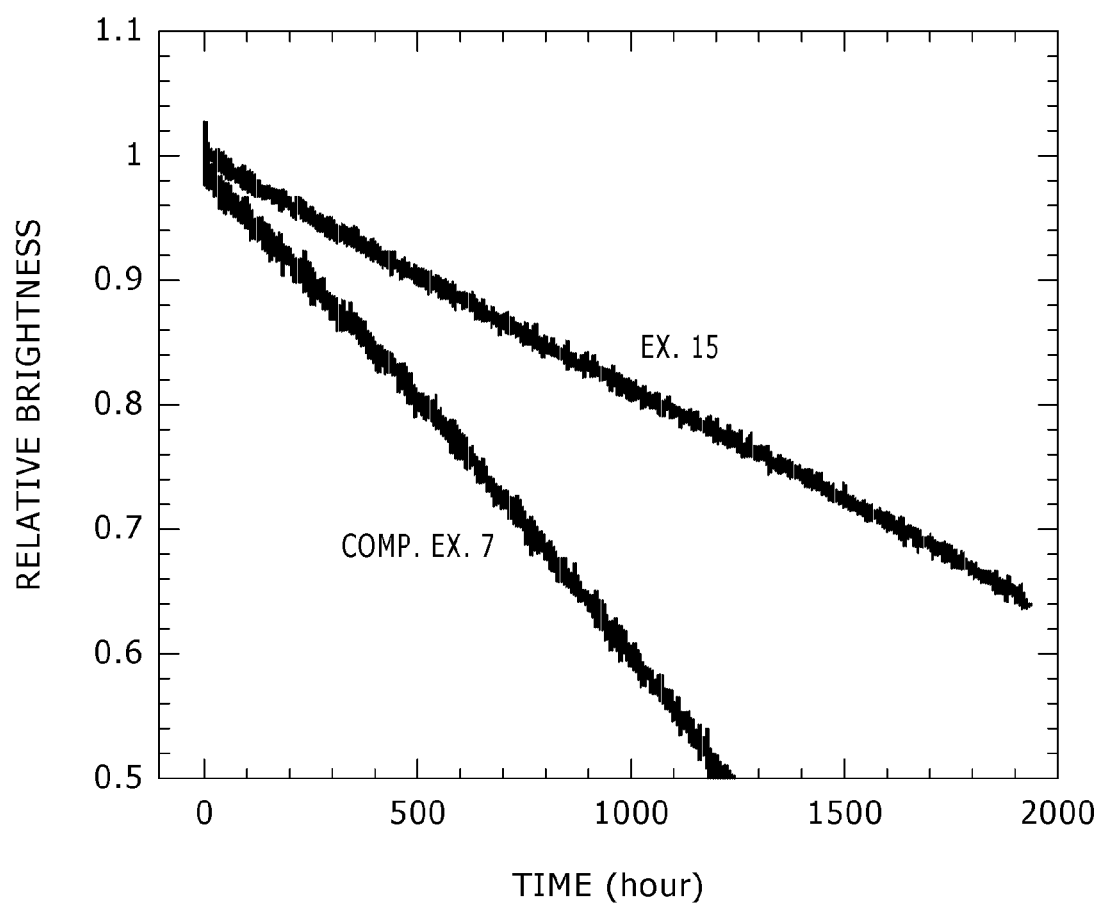
FIG. 11 is a diagrammatic representation illustrating time-dependent variations in relative brightness of display devices of Example 15 and Comparative Example 7.

FIG. 11 illustrates the results of lifetime measurements conducted on the display devices of Example 15 and Comparative Example 7 fabricated as described above. The measurements were conducted by setting the initial brightness at 1,500 cd/m² and the duty at Duty50 and maintaining the temperature at room temperature. It has been confirmed that even between the display devices having the intrinsic charge generation layers 15b formed using the organic compound represented by the structural formula (1)-10, the stacked display device fabricated in Example 15 was improved as much as twice in half lifetime over the mono unit display device of Comparative Example 7 and is effective for the improvement of long-term reliability. This difference can be attributed to the acceleration constants of the respective devices. As an acceleration constant is generally 1 or greater, an improvement as much as twice in efficiency is expected to leads to an improvement as much as twice or greater in lifetime. The above-described results were also obtained accordingly.

Examples 25 to 36

In Examples 25 to 36, display devices 11" were fabricated with a similar construction as the display device 11" of the fourth embodiment described with reference to FIG. 4 except that charge generation layers 15" were formed in the corresponding stacked structures with the corresponding materials. In these Examples 25 to 36, the transmission display devices 11" were fabricated by a similar procedure as in Examples 5 to 16 except that in the above-described fabrication procedure of Examples 5 to 16, the construction of the charge generation layer 15" was changed to the constructions shown below in Table 11, respectively.

TABLE 11

| | Display devices 11" | | | |
|---|---|---|---|---|
| | Intermediate cathode layer 15a" | Film thickness (Å) | Intrinsic charge generation layer 15b | Film thickness (Å) |
| Transmission type | | Charge generation layer 15") | | |
| Ex. 25 | Alq₃ + Mg (5%) | 50 | Structural formula (1)-10 | 50 |
| Ex. 26 | Alq₃ + Ca (5%) | 50 | Structural formula (1)-10 | 50 |

TABLE 11-continued

Display devices 11″

| | Intermediate cathode layer 15a″ | Film thickness (Å) | Intrinsic charge generation layer 15b | Film thickness (Å) |
|---|---|---|---|---|
| Ex. 27 | LiF/Alq$_3$ + Mg (5%) | 3/50 | Structural formula (1)-10 | 50 |
| Ex. 28 | LiF/Alq$_3$ + Ca (5%) | 3/50 | Structural formula (1)-10 | 50 |
| Ex. 29 | Alq$_3$ + Mg (30%) | 50 | Structural formula (1)-10 | 50 |
| Ex. 30 | Alq$_3$ + Mg (30%) | 50 | Structural formula (1)-10 | 50 |
| Ex. 31 | Alq$_3$ + Li (3%) | 50 | Structural formula (1)-10 | 50 |
| Ex. 32 | ADN + Li (3%) | 50 | Structural formula (1)-10 | 50 |
| Ex. 33 | Alq$_3$ + Cs (3%) | 50 | Structural formula (1)-10 | 50 |
| Ex. 34 | AND + Cs (3%) | 50 | Structural formula (1)-10 | 50 |
| Ex. 35 | LiF/Alq$_3$ + Li (3%) | 3/50 | Structural formula (1)-10 | 50 |
| Ex. 36 | LiF/Alq$_3$ + Cs (3%) | 3/50 | Structural formula (1)-10 | 50) |

| Comparative examples | Charge generation layer) |
|---|---|
| Comp. Ex. 13 | Mono unit (the cathode construction was similar to the charge generation layer in Example 27) |
| Comp. Ex. 14 | Mono unit (the cathode construction was similar to the charge generation layer in Example 28) |

Described specifically, in Examples 25 to 36, intermediate cathode layers 15a″ formed of mixed layers of an alkali metal or alkaline earth metal and an organic material (ADN or Alq) were used as intermediate cathode layers 15a″ in the charge generation layers 15″, respectively, as shown above in Table 11. In each of Examples 27, 28, 35 and 36, however, a stacked structure with a fluoride layer and a mixed layer stacked at the corresponding film thicknesses one over the other in this order from the side of an anode 13 was used. Furthermore, an intrinsic charge generation layer 15b arranged in contained with the intermediate cathode layer 15a″ was formed using the organic material represented by the structural formula (1)-10 in Table 1.

Comparative Example 13

In Comparative Example 13, a mono unit display device with only an anode 13, a light-emitting unit 14-1 and a cathode 16 formed therein was fabricated as in Comparative Example 7. However, the cathode 16 was formed with a similar construction as the charge generation layer 15″ in Example 27. Specifically, the cathode 16 had the construction of a first layer 16b/second layer 16b/third layer 16c=LiF(about 0.3 nm)/Alq$_{3+}$Mg(5%)(5 nm)/Al(20 nm). As a result, a transmission display device 11″ that light is outputted from the side of a substrate 12 was obtained.

Comparative Example 14

In Comparative Example 14, in the construction of Comparative Example 13, the cathode 16 was formed with a similar construction as the charge generation layer 15″ of Example 28. Specifically, the cathode 16 had the construction of a first layer 16b/second layer 16b/third layer 16c=LiF(about 0.3 nm)/Alq$_3$+Ca(5%)(5 nm)/Al(20 nm). As a result, a transmission display device 11″ that light is outputted from the side of a substrate 12 was obtained.

<<Assessment Results—5>>

Figure 12:
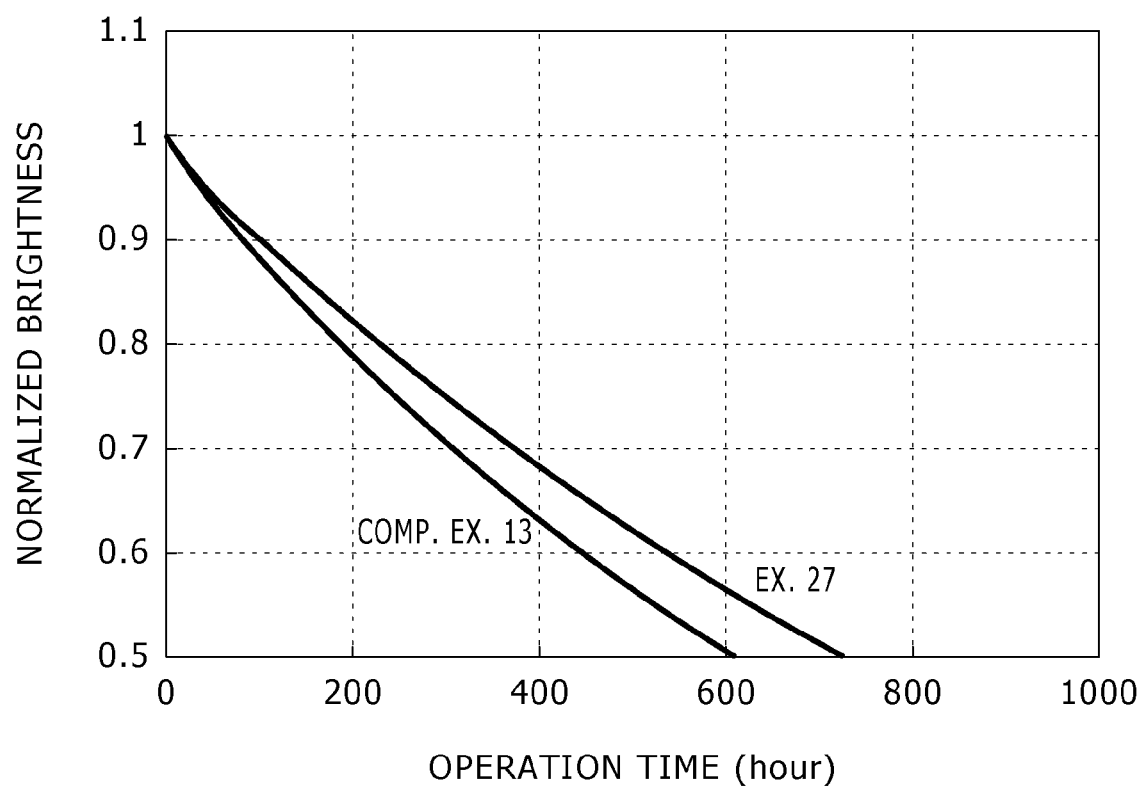
FIG. 12 is a diagrammatic representation illustrating time-dependent variations in relative brightness of display devices of Example 27 and Comparative Example 13.

FIG. 12 illustrates the results of lifetime characteristic measurements performed on the display devices of Examples 27 and Comparative Example 13 fabricated as described above. The measurements were performed at Duty50 and room temperature with the current density being set at 125 mA/cm$^2$. In those measurements, the initial brightness of Example 27 was about twice as high as that of Comparative Example 13. Because the half lifetime for the initial brightness of the display device of Example 27 was at substantially the same level as the half lifetime for the initial brightness of the display device of Comparative Example 13 as shown in FIG. 12, the construction of Example 27 brought about an efficiency-improving effect twice as much as or even greater than the construction of Comparative Example 13. Improvements in lifetime and efficiency have, therefore, been confirmed with respect to a display device of a stacked structure equipped with a charge generation layer 15″ formed by stacking a mixed layer, which contains at least one (Mg) of alkali metals and alkaline earth metals and an organic material (Alq$_3$), and an intrinsic charge generation layer 15b, which is formed of an organic compound represented by the structural formula (1)-10, one over the other as in Example 27.

The foregoing applies equally to a comparison between Example 28 and Comparative Example 14. However, the efficiency of the display device of Example 28 was only about 1.3 times the efficiency of the display device of Comparative Example 14. Nonetheless, when they were compared in lifetime under the same conditions as described above (measured at Duty50 and room temperature with the current density being set at 125 mA/cm$^2$), the half lifetime was substantially the same in Comparative Example 14 and Example 28. Accordingly, a lifetime-prolonging effect by the construction into a stacked structure has been confirmed.

Through a comparison between Examples 25 and 26 and Examples 27 and 28, it was able to more readily confirm an improvement in the efficiency of light emission and a lifetime-prolonging effect from the display devices of Examples 27 and 28, each of which had the intermediate cathode layer 15a″ of the stacked structure with LiF (conducting material layer) inserted on its interface side, than from the display devices of Examples 25 and 26 in each of which the intermediate cathode layer 15a″ had the single-layer construction. However, the differences were small, and as a matter of fact, the improvement in efficiency and prolongation of lifetime owing to the formation of each light-emitting unit into a stacked structure has been confirmed again.

Through a comparison among Examples 25, 29 and 30, the display devices of these Examples 25, 29 and 30, in which at least one (Mg) of alkali metals and alkaline earth metals was added in different amounts to the respective intermediate cathode layers 15$a''$, were able to obtain substantially the same efficiency of light emission as Example 25, but upon measurement of lifetime, showed greater variations as the proportion of Mg increased. Statistically analyzing, it was observed that in comparison with the lifetime-improving effect of Example 25, the lifetime-improving effect tended to become smaller in the order of Examples 29 and 30. This may be attributed presumably to changes in the film quality of the intermediate cathode layer 15$a''$ as a result of increases in the proportion of Mg. According to an investigation by the present inventors, the upper limit of the proportion of an alkali metal or alkaline earth metal is 50% or so (relative film thickness percentage) set in Example 30. It has been considered that a proportion greater than the upper limit leads to a reduction in transmittance and also to an increase in the non-stability of the film quality of the intermediate cathode layer 15$a''$ and is disadvantageous for the formation of a stacked structure with light-emitting units stacked together.

A comparison will now be made among Examples 31 to 34. In each of these display devices, Li or Cs, an alkali metal, was used, and as organic materials to be coevaporated, Alq$_3$ and ADN were used, respectively. In each of the display devices of Examples 31 to 34, the efficiency of light emission obtained was about twice as much as that of Comparative Example 13. With respect to the lifetime-improving effect, it was able to obtain substantially the same results as in FIG. 11.

Through a comparison between Examples 35 and 36, those display devices showed results of a similar tendency as the comparison between Examples 27 and 28 and Examples 25 and 26. It was, therefore, able to confirm again the efficiency-improving and lifetime-prolonging effects by a stacked structure with light-emitting units stacked together rather than by a stacked structure with LiF (a conducting material layer) inserted in an intermediate cathode layer 15$a''$.

Examples 37 to 58

In Examples 37 to 58, transmission display devices 11$c$, 11$c'$ or 11$c''$ such as that described with reference to FIG. 7 were fabricated. In the fabrication of each of the display devices of these Examples 37 to 58, a color changing layer 18 in which a color changing film 18$a$ for changing an excitation light source of the blue color wavelength into the red color wavelength and a color changing film 18$b$ for changing the excitation light source of the blue color wavelength into the green color had been patterned was firstly formed by photolithography, a known technology, on a substrate 12 made of a 30 mm×30 mm glass plate.

Subsequently, on an upper surface of each of such color changing layers 18, an anode 13 to a cathode 16 were formed in accordance with the above-described fabrication procedure of Examples 5 to 16. However, as hole injection layers 14$a$ in light-emitting units 14-1,14-2, 2-TNATA [4,4',4"-tris (2-naphtylphenylamino)triphenylamine] represented by the below-described structural formula (5) was deposited at 15 nm (deposition rate: 0.2 to 0.4 nm/sec). Further, the charge generation layers 15,15',15" were changed to the corresponding constructions shown below in Tables 12 to 14.

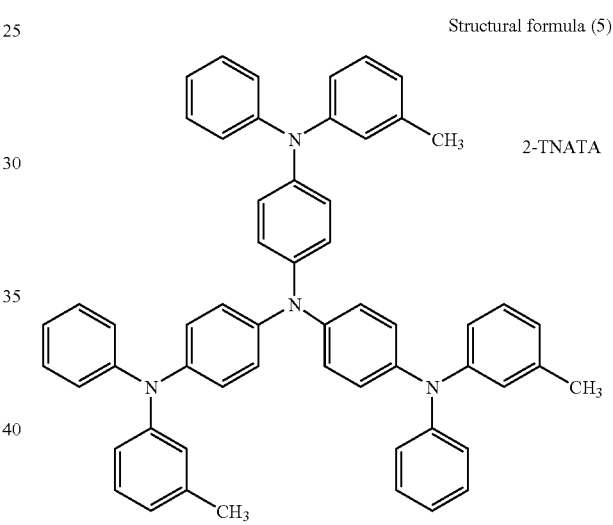

Structural formula (5)

2-TNATA

TABLE 12

| | Display devices 11c (with color changing layers) | | | | | |
|---|---|---|---|---|---|---|
| | | | Charge generation layer 15 | | | |
| Transmission type | Intermediate cathode layer 15a | Film thickness (Å) | Intrinsic charge generation layer 15b | Film thickness (Å) | Intermediate cathode layer | Film thickness (Å) |
| Ex. 37 | Li$_2$SiO$_3$ | 15 | V$_2$O$_5$ | 50 | — | — |
| Ex. 38 | Li$_2$SiO$_3$ | 15 | Structural formula (1)-10 | 50 | — | — |
| Ex. 39 | Li$_2$CO$_3$ | 15 | V$_2$O$_5$ | 50 | — | — |
| Ex. 40 | Li$_2$CO$_3$ | 15 | Structural formula (1)-10 | 50 | — | — |

TABLE 13

Display devices 11c' (with color changing layers)

| | Charge generation layer 15' | | | | | |
|---|---|---|---|---|---|---|
| | Intermediate cathode layer 15a' | | | | | |
| Transmission type | Fluoride layer 15a-1 | Film thickness (Å) | Insulating material layer 15a-2' | Film thickness (Å) | Intrinsic charge generation layer 15b | Film thickness (Å) |
| Ex. 41 | LiF | 3 | $Li_2SiO_3$ | 15 | $V_2O_5$ | 50 |
| Ex. 42 | LiF | 3 | $Li_2SiO_3$ | 15 | Structural formula (1)-10 | 50 |
| Ex. 43 | LiF | 3 | $Li_2CO_3$ | 15 | $V_2O_5$ | 50 |
| Ex. 44 | LiF | 3 | $Li_2CO_3$ | 15 | Structural formula (1)-10 | 50 |

TABLE 14

| | Charge generation layer 15" | | | |
|---|---|---|---|---|
| | Intermediate cathode layer 15a" | Film thickness (Å) | Intrinsic charge generation layer 15b | Film thickness (Å) |
| Display devices 11c" (with color changing layers) | | | | |
| Transmission type | | | | |
| Ex. 45 | $LiF/Alq_3 + Mg(1\%)$ | 3/50 | $V_2O_5$ | 50 |
| Ex. 46 | $LiF/Alq_3 + Mg(1\%)$ | 3/50 | Structural formula (1)-10 | 50 |
| Ex. 47 | $LiF/Alq_3 + Mg(2\%)$ | 3/50 | $V_2O_5$ | 50 |
| Ex. 48 | $LiF/Alq_3 + Mg(2\%)$ | 3/50 | Structural formula (1)-10 | 50 |
| Ex. 49 | $LiF/Alq_3 + Mg(5\%)$ | 3/50 | $V_2O_5$ | 50 |
| Ex. 50 | $LiF/Alq_3 + Mg(5\%)$ | 3/50 | Structural formula (1)-10 | 50 |
| Ex. 51 | $LiF/Alq_3 + Ca(3\%)$ | 3/50 | $V_2O_5$ | 50 |
| Ex. 52 | $LiF/Alq_3 + Ca(3\%)$ | 3/50 | Structural formula (1)-10 | 50 |
| Ex. 53 | $Alq_3 + Cs(3\%)$ | 50 | $V_2O_5$ | 50 |
| Ex. 54 | $Alq_3 + Ca(3\%)$ | 50 | Structural formula (1)-10 | 50 |
| Ex. 55 | $LiF/Alq_3 + Li(3\%)$ | 3/50 | $V_2O_5$ | 50 |
| Ex. 56 | $LiF/Alq_3 + Li(3\%)$ | 3/50 | Structural formula (1)-10 | 50 |
| Ex. 57 | $Alq_3 + Li(3\%)$ | 50 | $V_2O_5$ | 50 |
| Ex. 58 | $Alq_3 + Li(3\%)$ | 50 | Structural formula (1)-10 | 50 |
| Comp. Ex. 15 | | | Mono unit type | |
| Display devices 11a" (with color changing layers) | | | | |
| Surface-emitting type | | | | |
| Ex. 59 | $LiF/Alq_3 + Mg(5\%)$ | 50 | Structural formula (1)-10 | 50 |
| Comp. Ex. 16 | | | Mono unit type | |

Comparative Example 15

A mono unit display device was fabricated with a similar construction as the display device described with reference to FIG. 7 except that a color changing layer 18 was arranged between a substrate 12 and an anode 13, a light-emitting unit 14-1 was arranged over the anode 13, and a cathode 16 was arranged directly over the light-emitting unit 14-1. Following the fabrication procedure of Examples 37 to 58, only the color changing layer 18, anode 13, light-emitting unit 14-1 and cathode 16 were formed likewise.

<<Assessment Results—6>>

Figure 13:
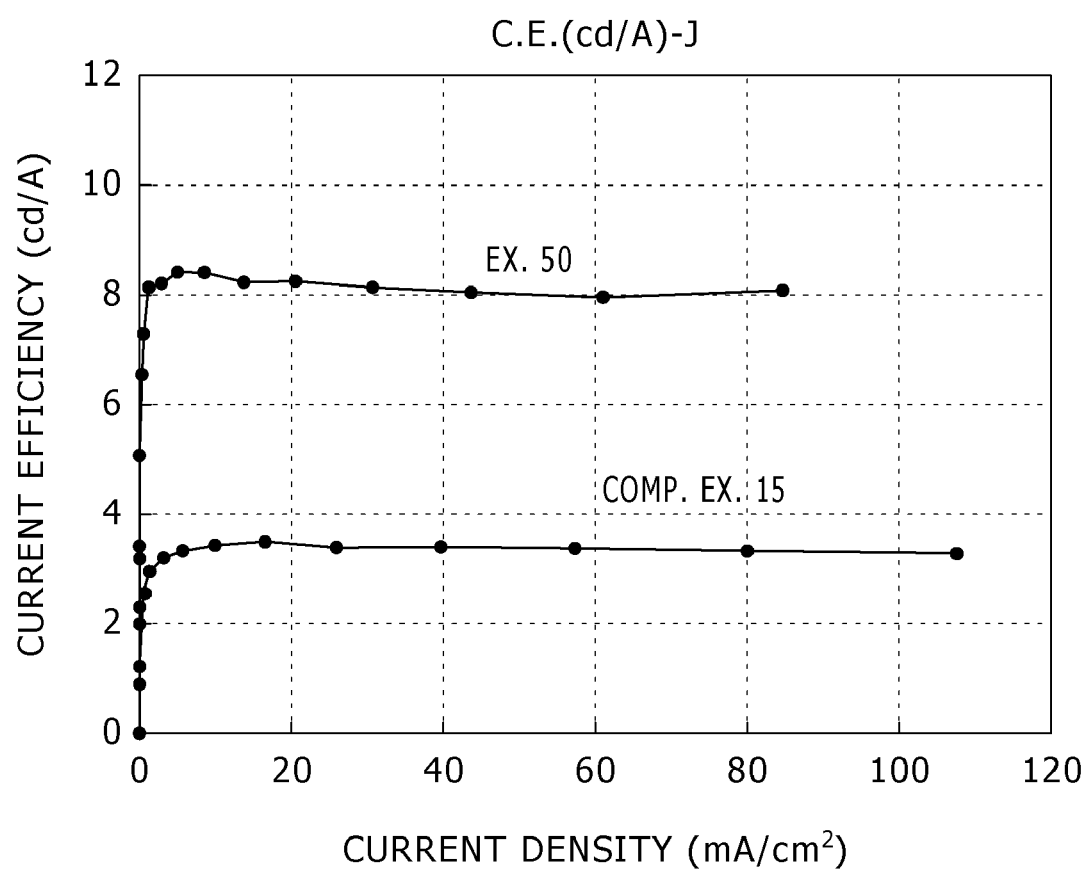
FIG. 13 is a diagrammatic representation illustrating the efficiencies of light emission by display devices of Example 50 and Comparative Example 15.

FIG. 13 illustrates the efficiencies of light emission by the display devices of Example 50 and Comparative Example 15 fabricated as mentioned above. As shown in the diagram, the efficiency of light emission by the display device of Example 50 was twice as high as the efficiency of light emission by the mono unit display device of Comparative Example 15. In each of the remaining ones of Examples 45 to 58, the efficiency of light emission was also twice as high as the efficiency of light emission by the mono unit display device of Comparative Example 15. The effect of the stacked charge generation layers 15 to 15" in the present invention has, therefore, been confirmed despite the use of the color changing layer 18.

Example 59

In Example 59, a surface-emitting display device 11c" was fabricated as described with reference to FIG. 5. Following the above-described fabrication procedure of Example 50, chromium (Cr: film thickness about 100 nm) was deposited as an anode 13 in place of ITO, and further, IZO (indium-zinc complex oxide) was deposited instead of Al at 200 nm as a third layer 16c of the cathode 16. The display device was therefore constructed to output light from the side of the cathode 16. A color changing layer 18, on the other hand, was formed over the cathode 16.

Comparative Example 16

A mono unit display device corresponding to Example 59 was fabricated.

<<Assessment Results—7>>

Figure 14:
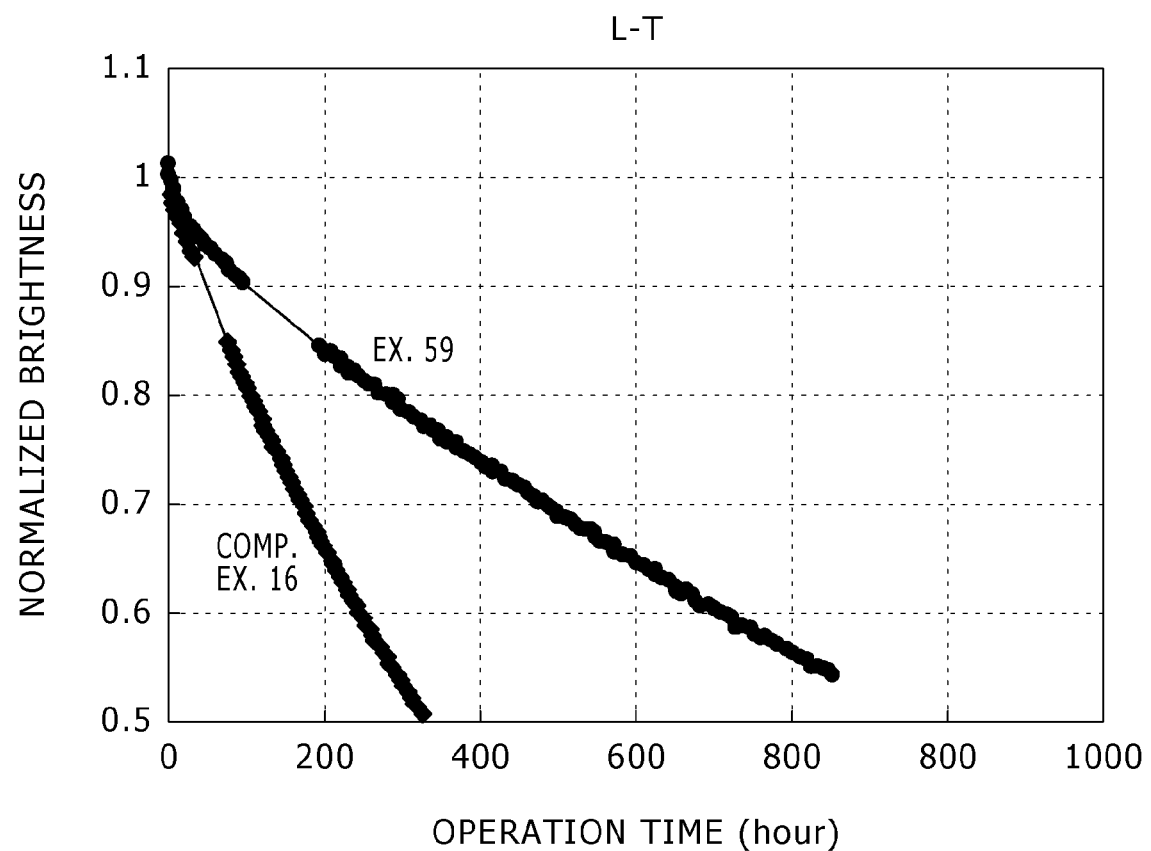
FIG. 14 is a diagrammatic representation illustrating time-dependent variations in relative brightness of display devices of Example 59 and Comparative Example 16.
Figure 15:
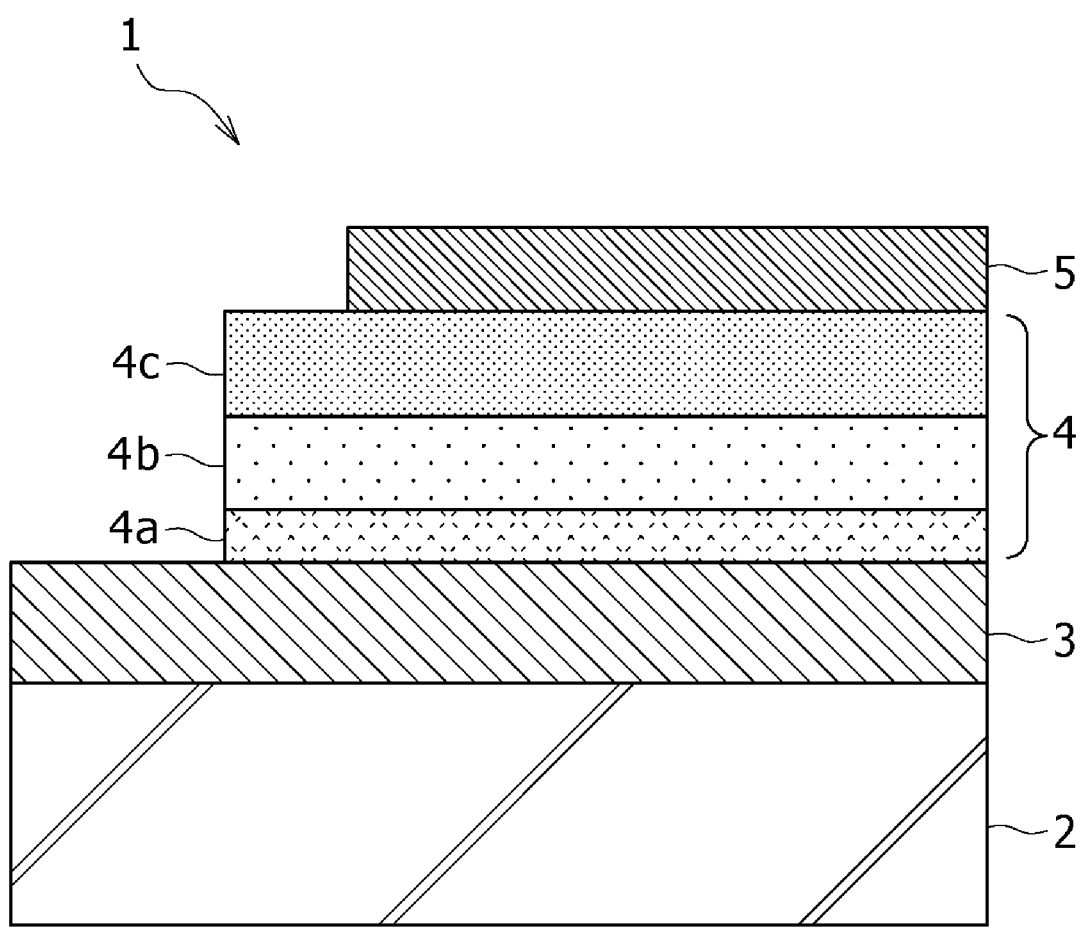
FIG. 15 is a cross-sectional view of a conventional display device.
Figure 16:
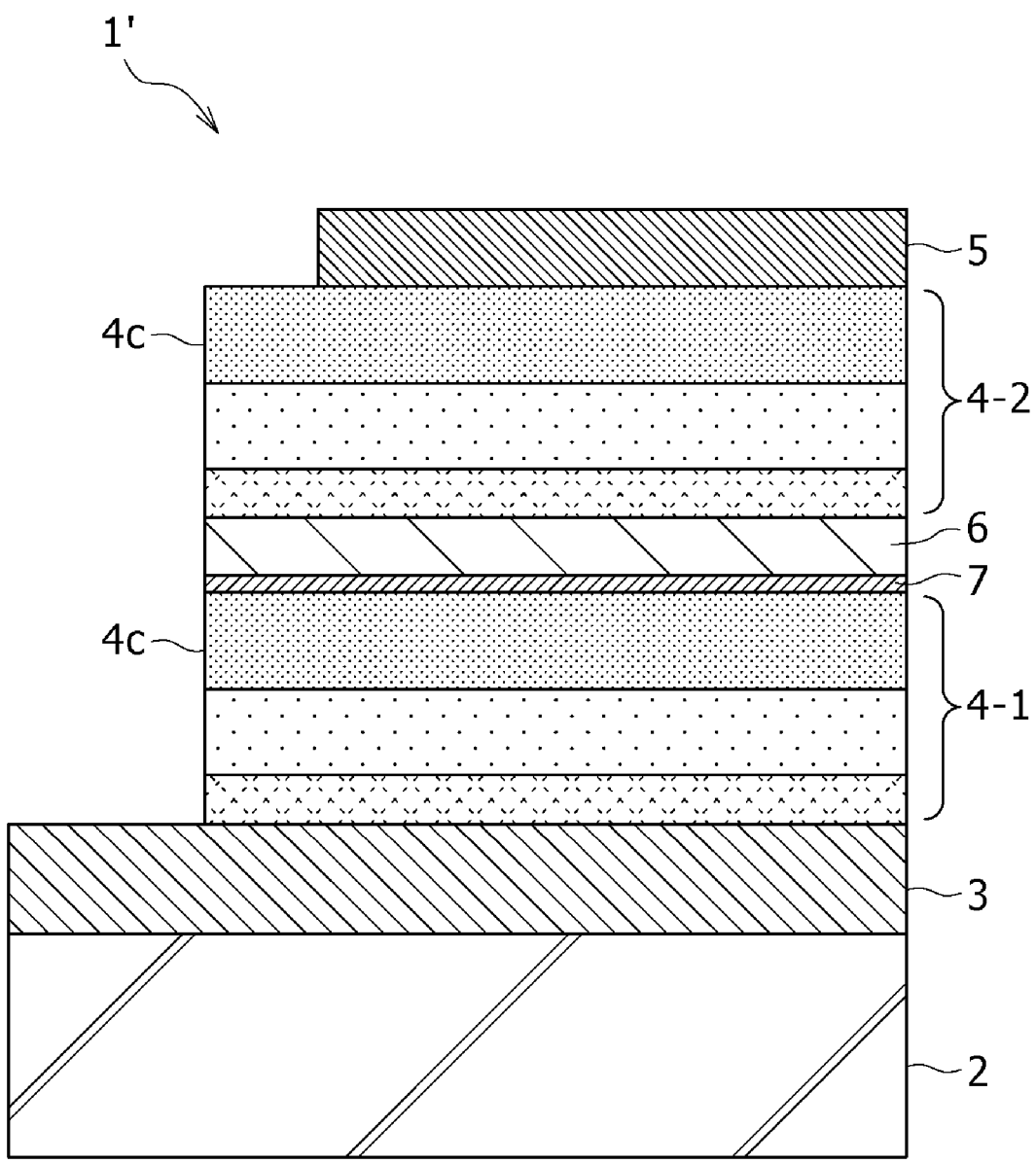
FIG. 16 is a cross-sectional device showing the construction of another conventional display device.

FIG. 14 illustrates the results of lifetime measurements conducted with the initial brightness set at 3,000 cd/m² on the display devices of Example 59 and Comparative Example 16 fabricated as described above. From the results, it has been confirmed that even in the device construction of the surface-transmitting type, the stacked display device fabricated in Example 59 was substantially improved in half lifetime over the mono unit display device of Comparative Example 16 and is effective for the improvement of long-term reliability.

The invention claimed is:

1. A display device comprising:
a cathode;
an anode;
a plurality of light-emitting units between said cathode and said anode; and
a charge generation layer between adjacent light-emitting units,
wherein,
each of said light-emitting units includes an organic light-emitting layer, and
said charge generation layer includes at least one of a complex oxide selected from $Li_2SiO_3$, $Li_2CO_3$ and $Cs_2CO_3$.

2. A display device according to claim 1, wherein said charge generation layer is composed of $Li_2SiO_3$.

3. A display device according to claim 1, wherein said charge generation layer includes $Li_2SiO_3$ and a charge transport material.

4. A display device according to claim 1, wherein said charge generation layer has a stacked structure comprised of a layer composed of $Li_2SiO_3$ and a second layer composed of $Li_2SiO_3$ and a charge transport material.

5. A display device according to claim 1, wherein said complex oxide in said charge generation layer forms an interfacial layer on an anode side of said charge generation layer.

6. A display device according to claim 1, further comprising an interfacial layer on a cathode side of said charge generation layer that is composed of an organic material having a phthalocyanine skeleton.

7. A display device according to claim 1, wherein said charge generation layer further comprises an organic compound represented by the following formula (1):

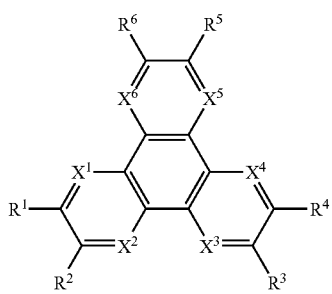

Formula (1)

wherein $R^1$ to $R^6$ are each independently a substituent selected from a hydrogen atom, a halogen atom, a hydroxyl group, an amino group, an arylamino group, a substituted or unsubstituted carbonyl group having not more than 20 carbon atoms, a substituted or unsubstituted carbonyl group having not more than 20 carbon atoms, a substituted or unsubstituted alkenyl group having not more than 20 carbon atoms, a substituted or unsubstituted alkoxyl group having not more than 20 carbon atoms, a substituted or unsubstituted aryl group having not more than 30 carbon atoms, a substituted or unsubstituted heterocyclic group having not more then 30 carbon atoms, a nitrile group, a nitro group, a cyano group, or a silyl group; each two adjacent ones of $R^m$ (m: 1 to 6) may be fused together via a cyclic structure associated therewith; and $X^1$ to $X^6$ are each independently a carbon or nitrogen atom.

8. A display device according to claim 7, wherein said complex oxide in said charge generation layer forms an interfacial layer on an anode side of side charge generation layer, and said organic compound forms an intrinsic charge generation layer arranged in contact with said interfacial layer.

9. A display device comprising:
a cathode;
an anode;
a plurality of light-emitting units between said cathode and said anode, each of said light-emitting units including at least an organic light-emitting layer;
a charge generation layer between adjacent light-emitting units; and
a first interfacial layer on an anode side of each charge generation layer, said first interfacial layer comprising a conducting material layer and a layer composed of a fluoride comprising at least one alkali metal or alkaline earth metal.

10. A display device according to claim 9, wherein said conducting material layer comprises at least one of magnesium, silver or aluminum.

11. A display device according to claim 9, further comprising a second interfacial layer on a cathode side of said charge generation layer said second interfacial layer comprised of an organic material having a phthalocyanine skeleton.

12. A display device according to claim 9, wherein said charge generation layer further comprises an organic compound represented by the following formula (1):

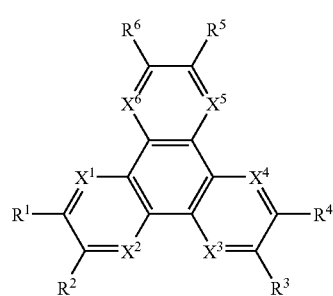

Formula (1)

wherein $R^1$ to $R^6$ are each independently a substituent selected from a hydrogen atom, a halogen atom, a hydroxyl group, an amino group, an arylamino group, a substituted or unsubstituted carbonyl group having not more than 20 carbon atoms, a substituted or unsubstituted carbonyl ester group having not more than 20 carbon atoms, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a substituted or unsubstituted aryl group having not more than 30 carbon atoms, a substituted or unsubstituted heterocyclic group having not more than 30 carbon atoms, a nitrile group, a nitro group, a cyano group, or a silyl group; each two adjacent ones of $R^m$ (m: 1 to 6) may be fused together via a cyclic structure associated therewith; and $X^1$ to $X^6$ are each independently a carbon or nitrogen atom.

13. A display device according to claim 12, wherein said organic compound forms an intrinsic charge generation layer in contact with said interfacial layer.

14. A display device comprising:
a cathode;
an anode;
a plurality of light-emitting units stacked between said cathode and said anode, each of said light-emitting units including at least an organic light-emitting layer; and
a charge generation layer between adjacent light-emitting units,
wherein,
said charge generation layer includes a mixed layer at least one element of alkali metals or alkaline earth metals and at least one of a complex oxide selected from $Li_2SiO_3$, $Li_2CO_3$ and $Cs_2CO_3$ of, and an intrinsic charge generation layer, stacked in contact with each other in this order from the side of said anode.

15. A display device according to claim 14, wherein said charge generation layer further comprises an organic compound represented by the following formula (1):

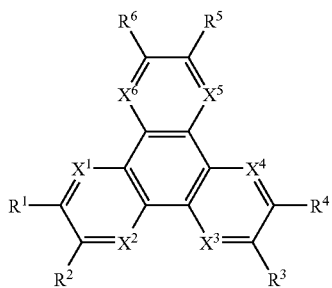

Formula (1)

wherein $R^1$ to $R^6$ are each independently a substituent selected from a hydrogen atom, a halogen atom, a hydroxyl group, an amino group, an arylamino group, a substituted or unsubstituted carbonyl group having not more than 20 carbon atoms, a substituted or unsubstituted carbonyl ester group having not more than 20 carbon atoms, a substituted or unsubstituted alkyl group having not more than 20 carbon atoms, a substituted or unsubstituted alkenyl group having not more than 20 carbon atoms, a substituted or unsubstituted alkoxyl group having not more than 20 carbon atoms, a substituted or unsubstituted aryl group having not more than 30 carbon atoms, a substituted or unsubstituted heterocyclic group having not more than 30 carbon atoms, a nitrile group, a nitro group, a cyano group, or a silyl group; each two adjacent ones of $R^m$ (in: 1 to 6) may be fused together via a cyclic structure associated therewith; and $X^1$ to $X^6$ are each independently a carbon or nitrogen atom.

16. A display device according to claim 14, wherein said alkali metals or alkaline earth metals in said mixed layer amounts to not more than 50% in terms of relative film thickness percentage.

17. A display device according to claim 14, further comprising an interfacial layer composed of a fluoride comprising at least one alkali metal or alkaline earth metals, said interfacial layer on an anode side of said charge generation layer.

18. A display device according to claim 14, further comprising an interfacial layer composed of an organic material having a phthalocyanine skeleton, said interfacial layer on a cathode side of said charge generation layer.

* * * * *